United States Patent
Myoung et al.

(10) Patent No.: US 10,256,366 B2
(45) Date of Patent: Apr. 9, 2019

(54) LIGHT-EMITTING DIODE AND METHOD OF FABRICATING THE SAME

(71) Applicant: UNIVERSITY-INDUSTRY FOUNDATION (UIF), YONSEI UNIVERSITY, Seoul (KR)

(72) Inventors: Jae-Min Myoung, Gyeonggi-do (KR); Sung-Doo Back, Seoul (KR)

(73) Assignee: UIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/716,026

(22) Filed: Sep. 26, 2017

(65) Prior Publication Data
US 2018/0122983 A1 May 3, 2018

(30) Foreign Application Priority Data
Nov. 2, 2016 (KR) .................. 10-2016-0145385

(51) Int. Cl.
- H01L 33/00 (2010.01)
- H01L 33/02 (2010.01)
- H01L 33/28 (2010.01)
- H01L 33/18 (2010.01)

(52) U.S. Cl.
CPC ........ *H01L 33/0083* (2013.01); *H01L 33/025* (2013.01); *H01L 33/18* (2013.01); *H01L 33/28* (2013.01); *H01L 33/285* (2013.01)

(58) Field of Classification Search
CPC .................................................. H01L 33/0083
USPC ............................................ 257/43; 438/104
See application file for complete search history.

(56) References Cited

U.S. PATENT DOCUMENTS

| | | | | |
|---|---|---|---|---|
| 6,624,442 B1* | 9/2003 | Kim | .................. | H01L 29/22 257/43 |
| 2002/0055003 A1* | 5/2002 | White | .................. | C23C 14/081 428/469 |
| 2004/0232412 A1* | 11/2004 | Burgener, II | ....... | H01L 21/0237 257/40 |
| 2007/0158661 A1* | 7/2007 | Lu | ................... | H01L 33/26 257/79 |
| 2008/0185580 A1* | 8/2008 | Kato | .................. | C23C 16/405 257/43 |

* cited by examiner

*Primary Examiner* — Igwe U Anya

(57) ABSTRACT

Provided are a light-emitting diode and a method of fabricating the same. The light-emitting diode includes a first electrode; a P-type zinc oxide layer which is formed on the first electrode and comprises nano-discs doped with an impurity or nano-rods of zinc oxide doped with an impurity; an N-type zinc oxide layer, which is formed on the P-type zinc oxide layer, comprises nano-rods, and the nano-rods of the N-type zinc oxide layer constitutes homojunction having an epitaxial interface with the P-type zinc oxide layer; and a second electrode, which is formed on the N-type zinc oxide layer.

17 Claims, 18 Drawing Sheets

LIGHT-EMITTING DIODE AND METHOD OF FABRICATING THE SAME

CROSS-REFERENCE TO RELATED APPLICATION

This application claims priority of Korean Patent Application No. 10-2016-0145385, filed on Nov. 2, 2016, in the KIPO (Korean Intellectual Property Office), the disclosure of which is incorporated herein entirely by reference.

BACKGROUND OF THE INVENTION

Field of the Invention

The present disclosure relates to a semiconductor device, and more particularly, to a light-emitting diode and a method of fabricating the same.

Description of the Related Art

In recent years, incandescent lamps and fluorescent lamps have been being replaced with solid-state lightings (SSLs) using light-emitting diodes (LEDs), organic light-emitting diodes (OLEDs), or polymer light-emitting diodes (PLEDs). To this end, direct-bandgap semiconductors in which a momentum at which the energy of the valence band is maximized is identical to a momentum at which the energy level of the conduction band is minimized are considered as candidates for the SSLs. Among the candidates for LED application, zinc oxide is being spotlighted due to various advantages, for example, a direct bandgap with an exciton binding energy of about 60 meV or higher and wide bandgap (about 3.37 eV), morphological diversity, and low cost fabrication.

However, the zinc oxide may be difficult to implement P-type conductivity and realize PN homojunction with the zinc oxide due to its inherent donor defects. As a result, LEDs based on heterojunctions in which N-type zinc oxide has a junction with other P-type material (e.g., p-GaN, p-Si, and P-type organic materials) prevail over that based on homojunction of zinc oxide.

However, LEDs of the homojunction with an epitaxial interface are generally preferred due to better light-emitting efficiency and lower power consumption than LEDs implemented with the heterojunction. The reason thereof is that a homojunction device including same materials having the P-type conductivity and N-type conductivity and having a consistent crystal lattice may preserve lattice periodicity at the interface. On the contrary, a heterojunction device may cause lattice mismatch at the interface between materials constituting the heterojunction. The lattice mismatch causes problems including interfacial defects and strains which deteriorate performance of the device.

Furthermore, most PN junction devices are fabricated in vacuum processes requiring a high temperature (e.g., 500° C. or higher). The high-temperature vacuum processes facilitate mixing of a dopant into a crystal lattice, but may cause the interface to have unclear homojunction due to inter-diffusion of the dopant. Furthermore, a flexible substrate cannot be utilized in a high temperature processes. In other words, the use of PN junction elements in the flexible device may be limited. Furthermore, high costs may be required for fabricating a LED in vacuum processes, and it may be difficult to increase size of the LED due to the physical limitations of equipment related to the vacuum processes.

SUMMARY OF THE INVENTION

Provided is a light-emitting diode that may be fabricated inexpensively and to have a large size, may improve light-emission efficiency, reduce power consumption, and have homojunction that may be formed in a low-temperature process.

Provided is a method of fabricating a light-emitting diode having the above-described advantages.

Additional aspects will be set forth in part in the description which follows and, in part, will be apparent from the description, or may be learned by practice of the presented embodiments.

According to an aspect of an embodiment, a light-emitting diode may include a first electrode; a P-type zinc oxide layer which is formed on the first electrode and comprises nano-discs doped with an impurity or nano-rods of zinc oxide doped with an impurity; an N-type zinc oxide layer, which is formed on the P-type zinc oxide layer, comprises nano-rods, and the nano-rods of the N-type zinc oxide layer constitutes homojunction having an epitaxial interface with the P-type zinc oxide layer; and a second electrode, which is formed on the N-type zinc oxide layer. The nano-disc may have a thickness from about 200 nm to about 800 nm and a diameter from about 300 nm to about 1 μm. In addition, the nano-discs may have a crystal structure grown in the [0002] direction. The nano-discs may have interplanar lattice spacing between Miller index (0002) planes within a range from 0.2 nm to 0.3 nm. Furthermore, the nano-discs may exhibit strong near-band-edge emission (NBE) characteristics at a wavelength from 350 nm to 420 nm in the ultraviolet (UV) domain and have a photoluminescence (PL) spectrum exhibiting a deep-level emission (DLE) characteristic that is relatively weaker than NBE at a wavelength from 450 nm to 750 nm in the visible ray domain.

The nano-rods may have a length from about 1 μm to about 4 μm and a thickness from about 100 nm to about 500 nm. The nano-rods may have a crystal structure grown in the [0002] direction. The nano-rods may have interplanar lattice spacing between Miller index (0001) planes within a range from 0.4 nm to 0.6 nm. In addition, the nano-rods may exhibit near-band-edge emission (NBE) characteristics at a wavelength from 350 nm to 420 nm in the ultraviolet (UV) domain and have a photoluminescence (PL) spectrum exhibiting a deep-level emission (DLE) characteristic that is relatively stronger than NBE at a wavelength from 450 nm to 750 nm in the visible ray domain.

In some embodiments, the impurity of the P-type zinc oxide layer may comprise any one of antimony (Sb), arsenic (As), phosphor (P), bismuth (Bi), and combinations thereof. Atomic concentration of the impurity may be within a range from 0.5% to 7% of atomic concentration of zinc. When the P-type zinc oxide layer comprises the nano-discs of zinc oxide doped with the impurity, the nano-discs may be used as a template for growth of the N-type zinc oxide layer comprising nano-rods of zinc oxide.

According to other aspect of an embodiment, a method of fabricating a light-emitting diode may include forming a first electrode on a substrate; forming a first conductivity type zinc oxide layer on the first electrode; forming a second conductivity type zinc oxide layer comprising nano-rods of zinc oxide on the first conductivity type zinc oxide layer in order to form homojunction having an epitaxial interface with the first conductivity type zinc oxide layer; and forming a second electrode on the second zinc oxide layer.

The forming of the first conductivity type zinc oxide layer on the first electrode may comprise forming a P-type zinc oxide layer comprising nano-discs of zinc oxide doped with an impurity on the first electrode, and the second zinc oxide layer may be an N-type zinc oxide layer comprising nano-rods of zinc oxide.

In some embodiments, synthesizing the nano-discs of zinc oxide doped with the impurity may be further performed. The synthesizing of the nano-discs may comprise: preparing a zinc precursor and a P-type dopant precursor; providing a first mixture by mixing the zinc precursor with the P-type dopant precursor; and inducing a chemical reaction in the first mixture in a high-pressure reactor.

Providing a second mixture by adding a structure-directing agent to the first mixture may be performed. In addition, the method may further include cooling a reacted material by using the high-pressure reactor; collecting precipitates comprising the nano-discs from the cooled reacted material; and obtaining the nano-discs from collected white precipitates.

The forming of the P-type zinc oxide layer may comprise: providing a dispersion solution having dispersed therein the nano-discs of zinc oxide; dripping the dispersion solution onto a surface of a base material to form a two-dimensional layer of the nano-discs of zinc oxide on the surface of the base material; and transferring the two-dimensional monolayer of the nano-discs of zinc oxide formed on the surface of the base material onto the first electrode.

In some examples, the forming of the N-type zinc oxide layer may comprise: filling gaps between the nano-discs with an electrical insulator; and growing the nano-rods on the top surfaces of the nano-discs using a hydrothermal synthesizing method. The forming of the second electrode may comprise filling gaps between the nano-rods with an electrical insulator; and forming the second electrode on the top surfaces of the nano-rods.

The forming of the first conductivity type zinc oxide layer on the first electrode may include forming a P-type zinc oxide layer comprising nano-rods of zinc oxide doped with the impurity on the first electrode, and the second zinc oxide layer is an N-type zinc oxide layer comprising nano-rods of zinc oxide, or the forming of the first conductivity type zinc oxide layer on the first electrode comprises forming an N-type zinc oxide layer comprising nano-rods of zinc oxide on the first electrode, and the second zinc oxide layer is a P-type zinc oxide layer comprising nano-rods of zinc oxide doped with the impurity.

According to an aspect of another embodiment, a method of fabricating a light-emitting diode, the method includes forming a first electrode on a substrate; forming a first conductivity type zinc oxide layer on the first electrode; forming a second conductivity type zinc oxide layer including nano-rods of zinc oxide on the first conductivity type zinc oxide layer in order to form homojunction having an epitaxial interface; and forming a second electrode on the second zinc oxide layer.

According to an embodiment, the forming of the first conductivity type zinc oxide layer on the first electrode includes forming a P-type zinc oxide layer including nano-discs of zinc oxide doped with an impurity on the first electrode, and the second zinc oxide layer may be an N-type zinc oxide layer including nano-rods of zinc oxide.

The method may further includes synthesizing the nano-discs of zinc oxide doped with an impurity, and the synthesizing of the nano-discs may include preparing a zinc precursor and a P-type dopant precursor; providing a first mixture by mixing the zinc precursor with the P-type dopant precursor; and reacting the first mixture in a high-pressure reactor. Here, the method may further include providing a second mixture by adding a structure-directing agent to the first mixture.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
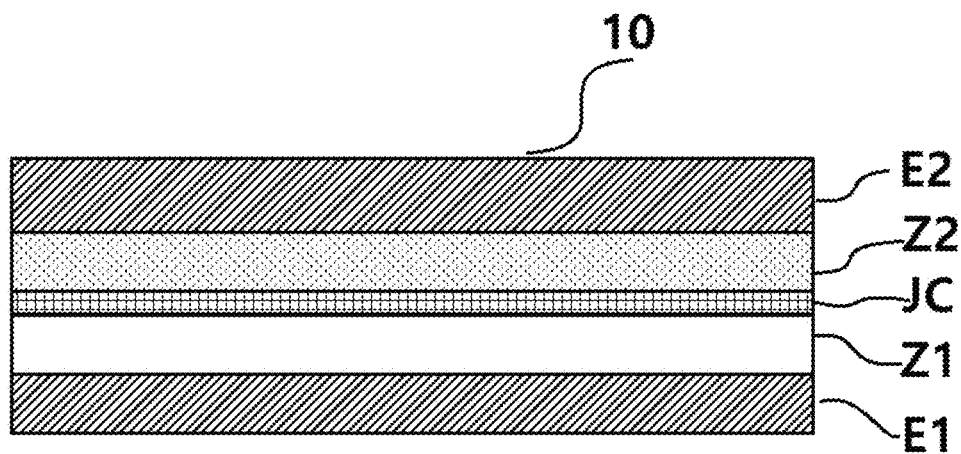
FIG. 1 is a cross-sectional view of a light-emitting diode 10 according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is a cross-sectional view of a light-emitting diode 10 according to an embodiment of the present invention. The light-emitting diode 10 may emit light of a red-based color, such as orange. According to an embodiment of the present invention, the light-emitting diode 10 may be capable of adjusting color of emitted light by controlling defect, thereby emitting blue light, white light, or green light.

Referring to FIG. 1, the light-emitting diode 10 may include a first electrode E1, a P-type zinc oxide layer Z1 that includes nano-discs of zinc oxide doped with an impurity and is formed on the first electrode E1, an N-type zinc oxide layer Z2 that includes a nano-rods of zinc oxide and is formed on the P-type zinc oxide layer Z1, and an electrode E2 formed on the N-type zinc oxide layer Z2. A homojunction (JC) with an epitaxial interface between the P-type zinc oxide layer Z1 and the N-type zinc oxide layer Z2 may be formed. The epitaxial interface may be formed between the nano-discs of zinc oxide doped with an impurity and the nano-rods of zinc oxide by epitaxially growing the nano-rods of zinc oxide on the nano-discs of the zinc oxide doped with an impurity. Furthermore, the grown nano-rods of zinc oxide may not be doped with an impurity, unlike the nano-discs of zinc oxide. According to another embodiment, through an additional operation, the grown nano-rods of zinc oxide may be doped with a same or different impurity as that contained in the nano-discs of zinc oxide.

The light-emitting diode 10 may be formed on a substrate (not shown). The substrate may be an insulating substrate, such as a glass substrate, a ceramic substrate, or a polyimide substrate, a semiconductor substrate, such as a silicon wafer, or even a conductive substrate, such as a lead frame for a chip packaging. Furthermore, an insulating film, such as silicon oxide, silicon nitride, or aluminum oxide, a metal conductive film, or a semiconductor film may be formed on a surface of such the substrate, but the present invention is not limited thereto. The substrate may include a flexible polymer material, such as a resin-based material or glass, because the light-emitting diode 10 may be synthesized at a low temperature as described below. The light-emitting diode 10 may be formed on a conductive substrate or a conductive film. In this case, the conductive substrate or conductive film may constitute the first electrode E1 of the light-emitting diode 10.

According to an embodiment of the present invention, the first electrode E1 may be a transparent conductive film, e.g., a transparent conductive metal oxide thin-film or a conductive nano-wire stack. The transparent conductive metal oxide thin-film may include an oxide-metal-oxide (OMO), zinc oxide (ZnO), Ga-doped ZnO (GZO), indium tin oxide (ITO), indium gallium oxide (IGO), indium zinc oxide (IZO), indium gallium zinc oxide (IGZO), or zinc tin oxide (ZTO). However, the metal oxide thin-film according to the present invention is not limited thereto. The conductive nano-wire stack may include at least one selected from among copper (Cu), silver (Ag), nickel (Ni), gold (Au), platinum (Pt), alloys thereof, carbon (C), silicon (Si), germanium (Ge), silicon oxide (SiO2), titanium oxide (TiO2), a tungsten oxide (WOX), gallium nitride (GaN), indium phosphate (InP), and silicon carbide (SiC). The shape of the nano-wire may be nano-tube-like shape or nano-rod-like shape.

According to an embodiment of the present invention, an OMO electrode may include any one structure from among IZO-Ag-IZO, ZTO/Ag/ZTO, AZO (aluminum zinc oxide)/Ag/AZO, GZO/Ag/GZO, ZnO/Ag/ZnO and SnOX/Ag/SnOX. However, the OMO electrode according to the present invention is not limited to those structures.

The P-type zinc oxide layer Z1 formed on the first electrode E1 based on a self-assembled monolayer (SAM) mechanism may include a plurality of nano-discs of zinc oxide doped with an impurity. The term "nano-disc" may refer to a nanometer-sized object having a three-dimensional structure with a height along the c-axis and a base along the (0002) plane. The base may have a circular shape (or an almost circular shape), an elliptical shape, a polygonal shape, or an irregular shape, and the height (or the thickness) of the nano-disc may be less than the diameter of the base. According to the present invention, each zinc oxide nano-disc may include a zinc oxide single crystal or zinc oxide polycrystal and, in the latter case, the zinc oxide crystal of the nano-disc may grow in the c-axis of the nano-disc which may extend in a direction perpendicular to the base of the nano-disc. The nano-disc and the nano-rod as described above may be distinguished from each other by their structure, wherein the height of the nano-rod may be greater than the diameter of the base.

According to an embodiment of the present invention, a self-assembled monolayer (SAM) may be formed using an alcoholic organic solvent. For example, when alcohol used as a dispersion solution is dripped onto a surface of a base material (e.g., liquid such as water, however the base material may be solid), the alcohol may be dispersed along the surface of the base material, and particles dispersed along with the alcohol may be self-aligned as a monolayer between the base material and the air. Thereafter, the alcohol may be naturally mixed with the base material. Therefore, in order to self-align the particles in the dispersion solution on the surface of the base material, various variables, such as a solubility of the dispersion solution, a concentration and a particle size of the dispersed particles, and a surface tension of the treatment, may be taken into account.

The impurity of the P-type zinc oxide layer Z1 may include any one of antimony (Sb), arsenic (As), phosphor (P), bismuth (Bi), and combinations thereof, where the atomic concentration of the impurity may be from 0.5% to 7% in relation to zinc atoms. When the atomic concentration of the impurity is less than 0.5%, sufficient hole carrier concentration may not be secured in the zinc oxide discs, and thus a PN homojunction between the zinc oxide discs and the n-type nano-rods may not be formed when the n-type nano-rods are bonded with the zinc oxide discs. Furthermore, when the atomic concentration of the impurity is 7% or higher, crystallization of the zinc oxide is seriously deteriorated. As a result, the n-type nano-rods are grown in random directions instead of a vertical direction, and thus light-emission efficiency may be reduced.

The nano-discs of the P-type zinc oxide layer Z1 may have a thickness from about 200 nm to about 800 nm, may have a diameter from about 300 nm to about 1 μm, and may have a single crystal structure grown along the [0002] direction. When the thickness or diameter of the nano-disc of the P-type zinc oxide layer Z1 is smaller than the above-stated range, monolayer self-alignment through the SAM may become difficult. On the contrary, when the thickness or diameter of the nano-disc of the P-type zinc oxide layer Z1 may be greater than the above-stated range, it may be difficult to synthesize the nano-discs.

Furthermore, the nano-discs of the P-type zinc oxide layer Z1 may have interplanar lattice spacing between Miller index (0002) surfaces within a range from 0.2 nm to 0.3 nm. The nano-discs of the P-type zinc oxide layer Z1 may exhibit strong near-band-edge emission (NBE) characteristics at a wavelength from 350 nm to 420 nm in the ultraviolet (UV) domain and may have a photoluminescence (PL) spectrum exhibiting a deep-level emission (DLE) characteristic that is relatively weaker than NBE at a wavelength from 450 nm to 750 nm in the visible ray domain.

According to an embodiment of the present invention, the nano-discs of zinc oxide doped with the impurity may be used as a template for growing the nano-rods of zinc oxide of the N-type zinc oxide layer Z2. Furthermore, the conductivity of the P-type zinc oxide layer Z1 may be determined based on a complex formed by at least one impurity in the zinc oxide doped with the impurity and at least one vacancy of zinc.

The N-type zinc oxide layer Z2, which is formed on the P-type zinc oxide layer Z1 by a hydrothermal synthesis method, may include a plurality of nano-rods of zinc oxide. In embodiments of the present invention, the nano-rods of zinc oxide of the N-type zinc oxide layer Z2 are not formed on an additional seed layer, but are formed directly on the nano-discs of zinc oxide doped with the impurity of the P-type zinc oxide layer Z1 via epitaxial growth. Therefore, deterioration of light-emission efficiency due to an additional seed layer may be omitted when the junction is established between the N-type zinc oxide layer Z2 and the P-type zinc oxide layer Z1. Furthermore, since it is not necessary to prepare a separate seed layer for growing the zinc oxide nano-rods and the junction between the N-type zinc oxide layer Z2 and the P-type zinc oxide layer Z1 is formed via epitaxial growth, the overall fabrication process may be simplified.

The nano-rods of the N-type zinc oxide layer Z2 may have a length from about 1 μm to about 4 μm and a thickness from about 100 nm to about 500 nm. Furthermore, the nano-rods of the N-type zinc oxide layer Z2 have a crystal structure grown along the [0002] direction and may have interplanar lattice spacing between Miller index (0001) planes within a range from 0.4 nm to 0.6 nm. Furthermore, the nano-rods of the N-type zinc oxide layer Z2 may exhibit weak near-band-edge emission (NBE) characteristics at a wavelength from 350 nm to 420 nm in the ultraviolet (UV) domain and may have a photoluminescence spectrum exhibiting a deep-level emission (DLE) characteristic that is relatively stronger than NBE at a wavelength from 450 nm to 750 nm in the visible ray domain.

The second electrode E2 formed on the N-type zinc oxide layer Z2 may include a material having different characteristics from those of the material constituting the first electrode E1. For example, when the first electrode E1 is a transparent OMO electrode, the second electrode E2 may be a metal electrode, e.g., a gold (Au), platinum (Pt), ruthenium (Ru) electrode. However, the present invention is not limited thereto.

In other embodiment of the present invention, the second electrode E2 and the first electrode E1 may include materials having the same characteristics. For example, both the second electrode E2 and the first electrode E1 may be transparent conductive metal oxide thin-films or a conductive nano-wire stacks.

As described above, the light-emitting diode 10 according to the present invention may include a homojunction (JC) having an epitaxial interface, and thus the light-emission efficiency may be increased and power consumption may be minimized. Furthermore, since the P-type zinc oxide layer Z1 and the N-type zinc oxide layer Z2 of the light-emitting diode 10 are all formed through low-temperature processes, fabricating cost may be reduced and the light-emitting diode 10 may be fabricated to have a large size.

Furthermore, although the light-emitting diode 10 having a structure in which the homojunction (JC) having an epitaxial interface is formed between the P-type zinc oxide layer Z1 including nano-discs and the N-type zinc oxide layer Z2 including nano-rods is described above, the P-type zinc oxide layer Z1 including nano-discs may be replaced with the P-type zinc oxide layer Z1 including nano-rods like the N-type zinc oxide layer Z2. Therefore, according to another embodiment of the present invention, the light-emitting diode 10 having a structure in which the homojunction (JC) having an epitaxial interface is formed between the P-type zinc oxide layer Z1 including nano-rods and the N-type zinc oxide layer Z2 including nano-rods may be provided. The epitaxial interface may be formed between the nano-rods of the P-type zinc oxide doped with an impurity and the nano-rods of the N-type zinc oxide by epitaxially growing the nano-rods of the N-type zinc oxide on the nano-rods of the P-type zinc oxide doped with the impurity. In other example, the epitaxial interface may be formed by epitaxially growing the nano-rods of the P-type zinc oxide doped with the impurity on the nano-rods of the N-type zinc oxide doped with the impurity. According to another embodiment, the nano-rods of the grown zinc oxide may not be doped with an impurity unlike the fore-mentioned nano-rods of the zinc oxide or, through an additional process, the nano-rods of the grown zinc oxide may be doped with an impurity identical to or different from the impurity included in the nano-rods of the zinc oxide.

Figure 2A:
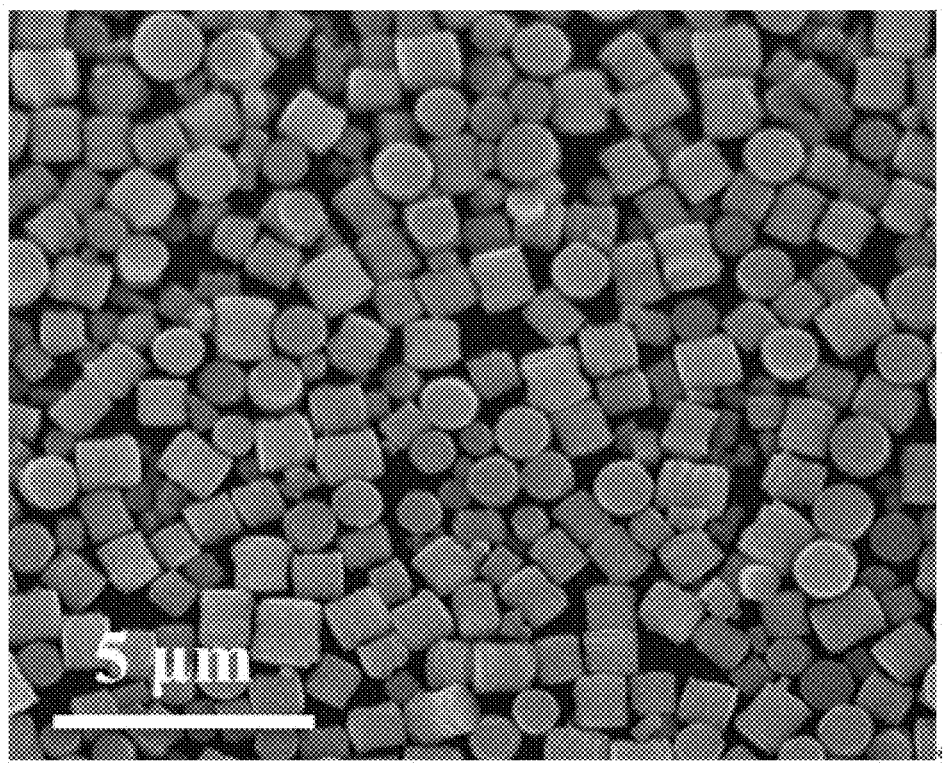
FIGS. 2A through 2D are scanning electron microscope (SEM) images of nano-discs of zinc oxide according to an embodiment of the present invention.
Figure 2B:
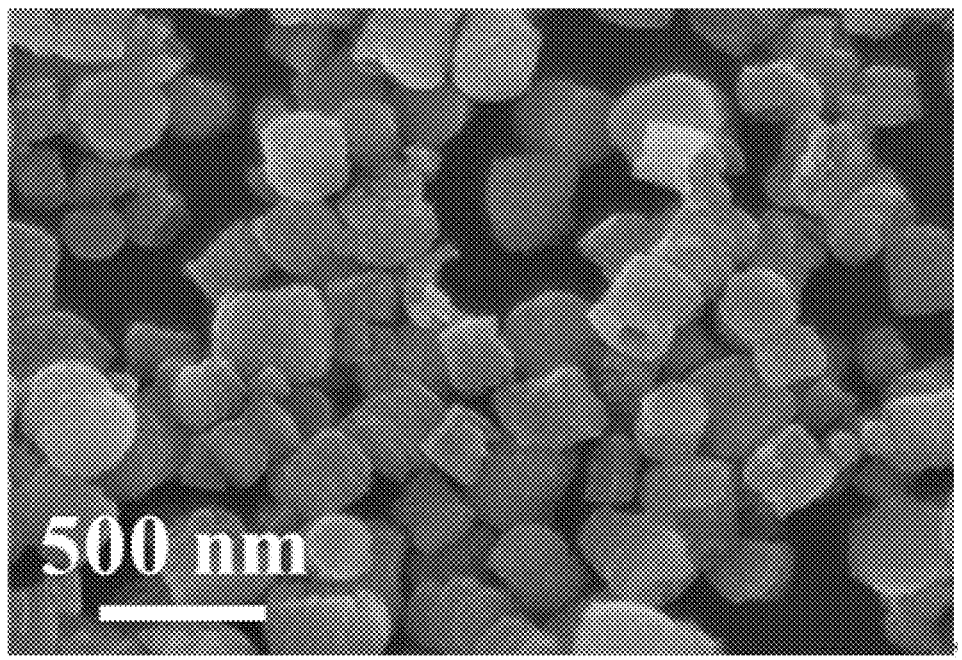
Figure 2C:
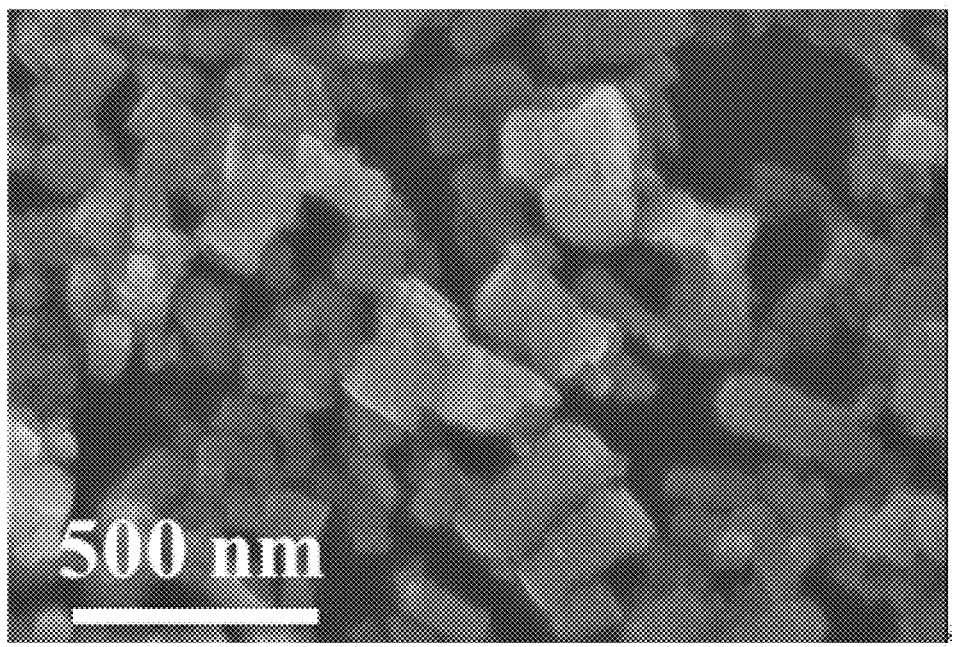
Figure 2D:
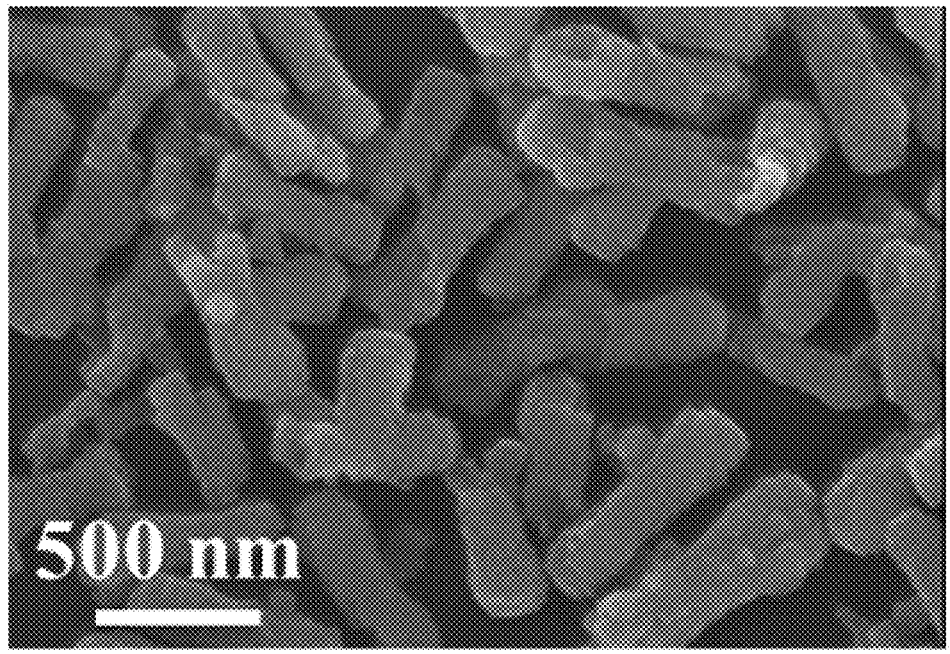

FIGS. 2A through 2D are scanning electron microscope (SEM) images of nano-discs of zinc oxide according to an embodiment of the present invention. FIG. 2A is a SEM image of the nano-discs of zinc oxide when the atomic concentration of antimony (Sb) is 0.5% of the atomic concentration of zinc, FIG. 2B is a SEM image of the nano-discs when the atomic concentration of antimony (Sb) is 1.0% of the atomic concentration of zinc, FIG. 2C is a SEM image of the nano-discs when the atomic concentration of antimony (Sb) is 1.5% of the atomic concentration of zinc, and FIG. 2D is a SEM image of the nano-discs when the atomic concentration of antimony (Sb) is 2.0% of the atomic concentration of zinc.

Referring to FIGS. 2A through 2D, as the atomic concentration of antimony (Sb) increases, the nano-disc may be transformed into a nano-rod-like shape. The reason thereof may be that the increase in concentration of an antimony precursor changes pH of a solution by adding CH3COO—, thereby ultimately changing the shape of the zinc oxide.

Figure 2E:
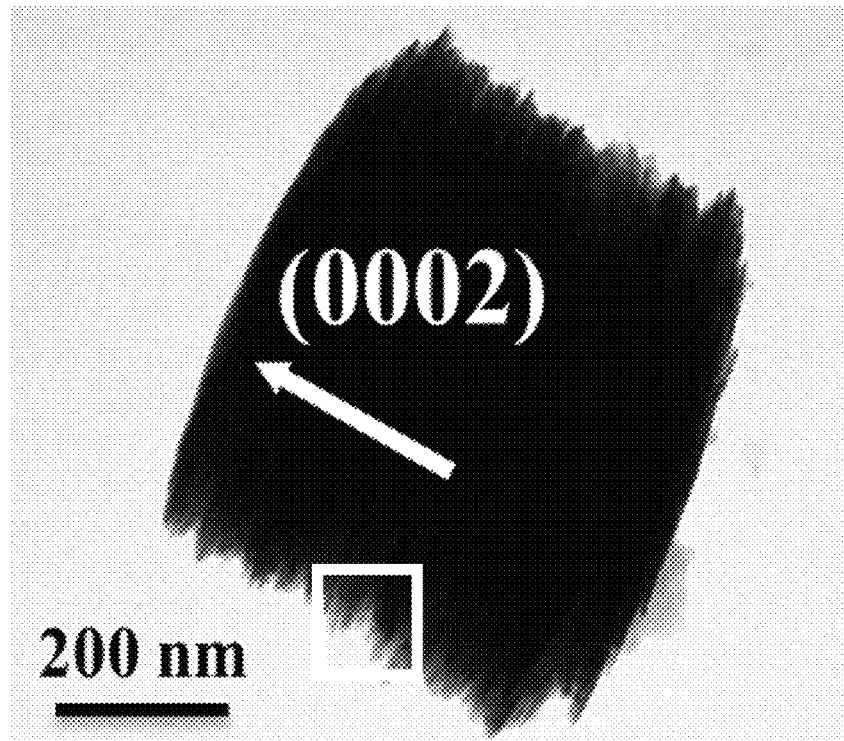
FIG. 2E is a low-magnification transmission electron microscope (TEM) image of nano-discs of zinc oxide according to an embodiment of the present invention.

FIG. 2E is a low-magnification transmission electron microscope (TEM) image of nano-discs of zinc oxide according to an embodiment of the present invention. FIG. 2E is a TEM image showing the diameter of a nano-disc of zinc oxide when the atomic concentration of antimony (Sb) is 0.5% of the atomic concentration of zinc.

Referring to FIG. 2E, a nano-disc of zinc oxide has a three-dimensional structure having a width along the c-axis and a three-dimensional base along the (0002) plane. The base may have a circular shape, an almost circular shape, an elliptical shape, a polygonal shape, or an irregular shape, and the thickness of the nano-disc may be smaller than the diameter of the base. For example, the average diameter of the nano-disc of the zinc oxide may be about 650 nm, and the thickness of the zinc oxide may be smaller than or equal to about 650 nm.

Figure 2F:
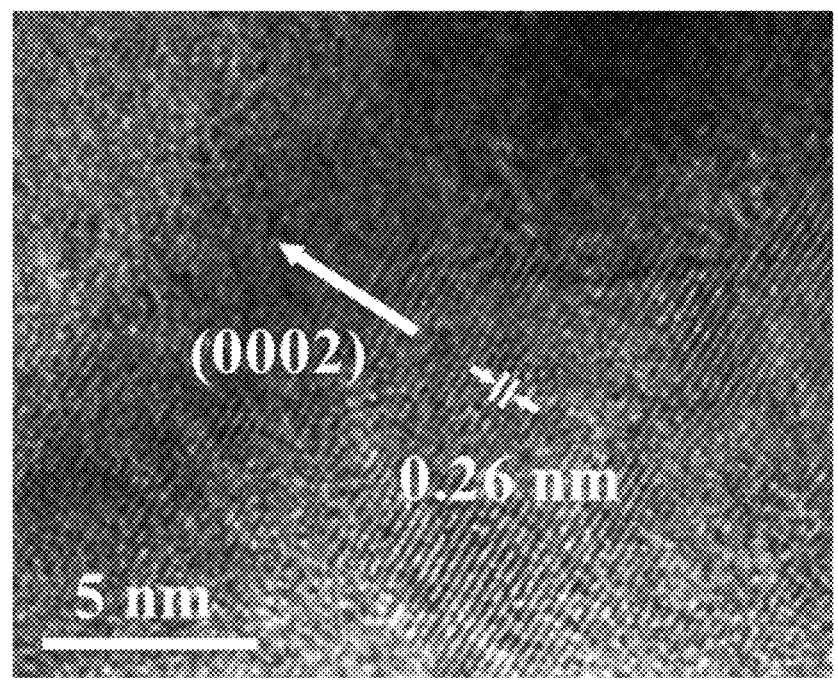
FIG. 2F is a high-resolution TEM (HRTEM) image of a nano-disc of zinc oxide having an interplanar lattice spacing according to an embodiment of the present invention.

FIG. 2F is a high-resolution TEM (HRTEM) image of a nano-disc of zinc oxide exhibiting an interplanar lattice spacing according to an embodiment of the present invention. FIG. 2F is a TEM image showing the highlighted portion of FIG. 2E in closer detail.

Referring to FIG. 2F, the nano-disc of zinc oxide exhibits a lattice fringe characteristic having an interval distance of 0.26 nm between (0002) planes adjacent to each other. Furthermore, the nano-disc of zinc oxide has a limited area electron diffraction (SAED) pattern in the direction. Through the SAED pattern, the single crystallinity of the nano-discs of zinc oxide may be aligned along the c-axis, and thus the nano-discs of zinc oxide doped with antimony (Sb) may be utilized as a template for growth of nano-rods of zinc oxide.

Figure 3A:
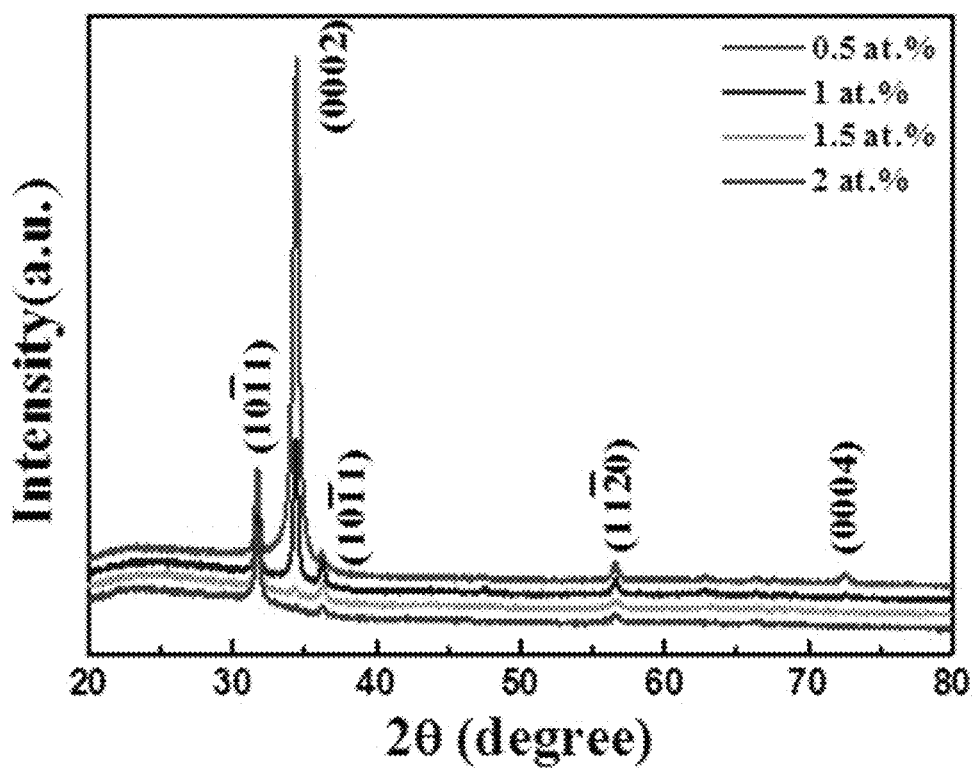
FIG. 3A is a graph showing X-ray diffraction (XRD) spectra of nano-discs of zinc oxide according to an embodiment of the present invention.

FIG. 3A is a graph showing X-ray diffraction (XRD) spectra of nano-discs of zinc oxide according to an embodiment of the present invention. FIG. 3A shows XRD spectra for measuring the crystallinity of nano-crystals doped with antimony (Sb) when the atomic concentrations of antimony (Sb) are 0.5%, 1.0%, 1.5%, and 2.0% of the atomic concentration of zinc, respectively.

Referring to FIG. 3A, the nano-discs of zinc oxide doped with 0.5 at. % of antimony (Sb) exhibit a (0002) peak. As the concentration of antimony (Sb) precursor increases, the (0002) peak becomes weaker and the crystallinity decreases. The nano-discs of zinc oxide doped with 1.5 at. % or 2.0 at. % of antimony (Sb) exhibit almost no (0002) peak. As the concentration of the antimony (Sb) precursor increases, the crystallinity of the nano-discs along the c-axis is deteriorated. Therefore, when nano-discs of zinc oxide heavily doped with an impurity are used as templates for growth of nano-rods of zinc oxide, a light-emission efficiency and performance of the light-emitting diode 10 may be degraded.

Figure 3B:
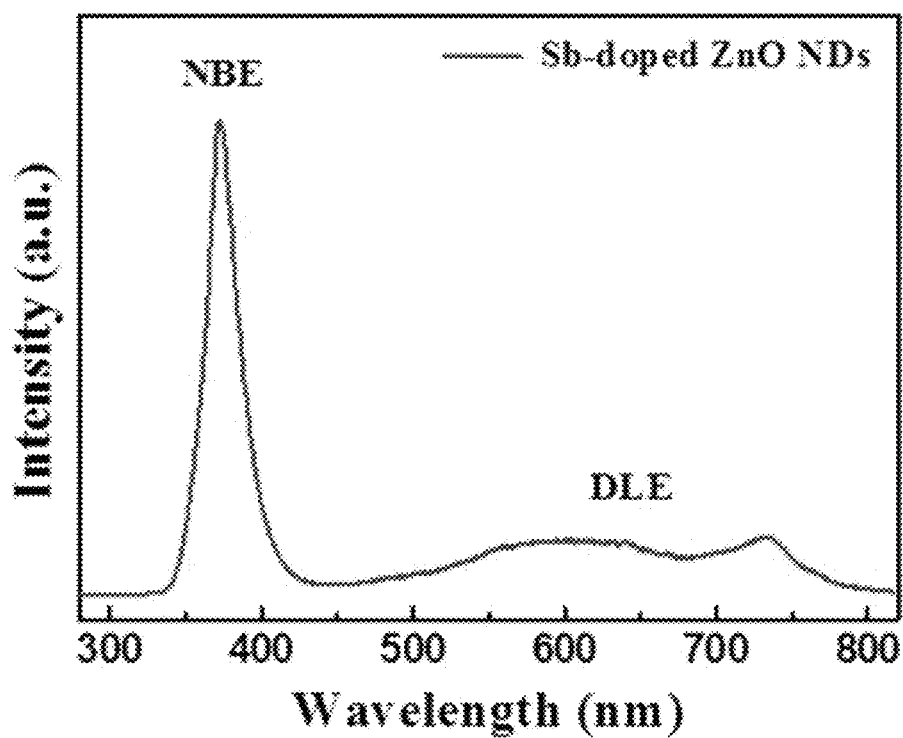
FIG. 3B is a graph showing PL spectra of nano-discs of zinc oxide according to an embodiment of the present invention.

FIG. 3B is a graph showing PL spectra of nano-discs of zinc oxide according to an embodiment of the present invention.

Referring to FIG. 3B, a room temperature PL spectrum of the nano-discs of zinc oxide exhibits a strong near-band-edge emission (NBE) characteristic and a weak deep-level emission (DLE) characteristic at a wavelength of about 375 nm. Therefore, it seems that the nano-discs of zinc oxide doped with antimony (Sb) do not have deep-level defects. Generally, a NBE peak is due to free exciton recombination and a DLE peak is due to defects including oxygen vacancy, zinc vacancy, interstitial oxygen, interstitial zinc, etc. Electroluminescence phenomena associated with nano-discs are affected by NBE and are relatively less affected by DLE.

FIGS. 4A through 4D are graphs showing X-ray photoelectron spectroscopy (XPS) spectra of nano-discs of zinc oxide according to an embodiment of the present invention. Through XPS spectral analysis, binding state of antimony (Sb) atoms in a zinc oxide lattice may be confirmed.

Figure 4A:
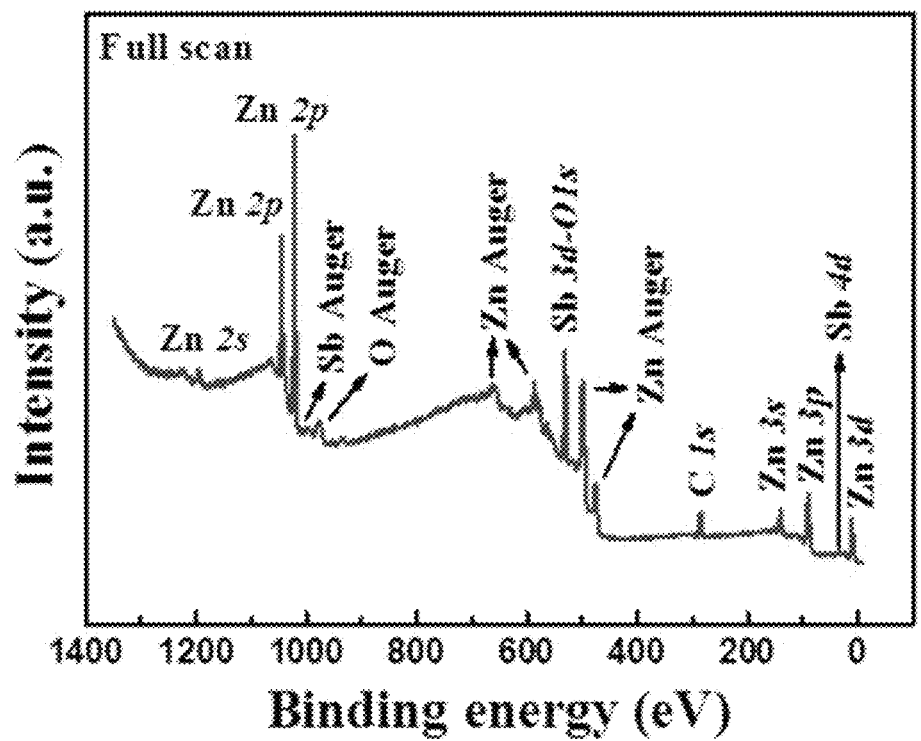
FIGS. 4A through 4D are graphs showing X-ray photoelectron spectroscopy (XPS) spectra of nano-discs of zinc oxide according to an embodiment of the present invention.

Referring to FIG. 4A, in the full-scan XPS spectrum of nano-discs of zinc oxide doped with 0.5 at. % of antimony (Sb), the chemical purity of nano-discs including peaks exclusively related to Zn, O, and Sb may be identified. The XPS spectra may be distinguished by positions of photo-electrons before emission (1s, 2s, 2p, etc.).

Figure 4B:
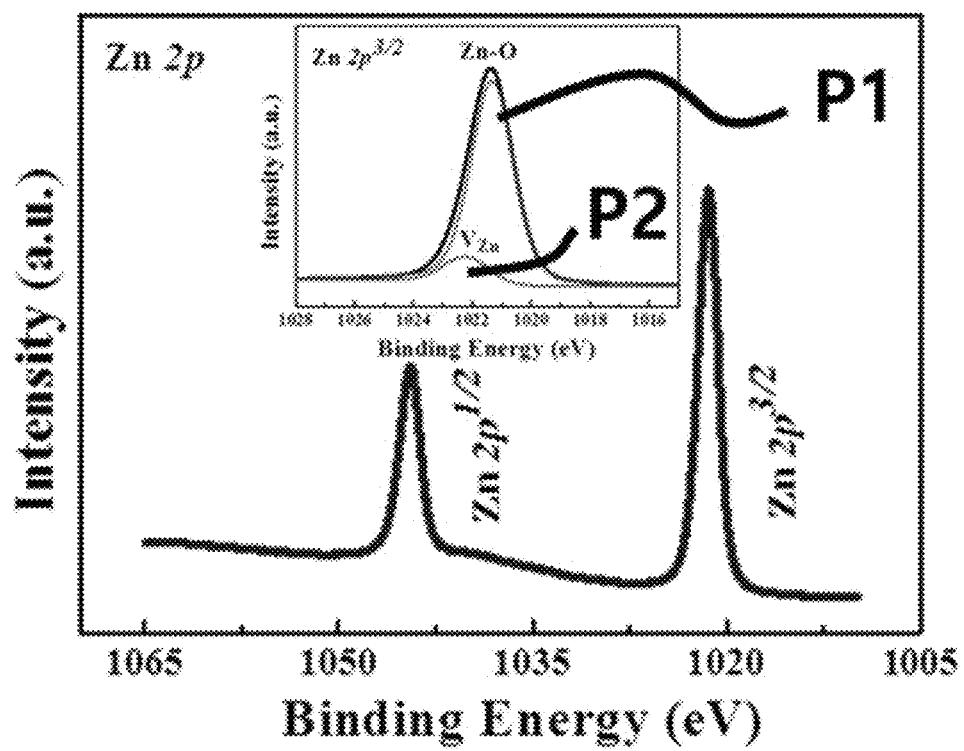

Referring to FIG. 4B, the core level Zn 2p has a spin-orbital splitting (SOS) value of about 23 eV between Zn $2p^{3/2}$ and $2p^{1/2}$. Here, in order to determine the presence of defect states associated with Zn, Zn $2p^{3/2}$ may be deconvoluted according to asymmetry of peaks. The deconvolution result shows that peaks P1 and P2 appear at a binding energy of about 1023.3 eV and a binding energy of about 1022.3 eV, respectively. It seems that the peak P1 at about 1023.3 eV is due to Zn bound to oxygen (O) atoms in a zinc oxide lattice, whereas the peak P2 at about 1022.3 eV is due to presence or absence of zinc vacancy $V_{Zn}$.

Figure 4C:
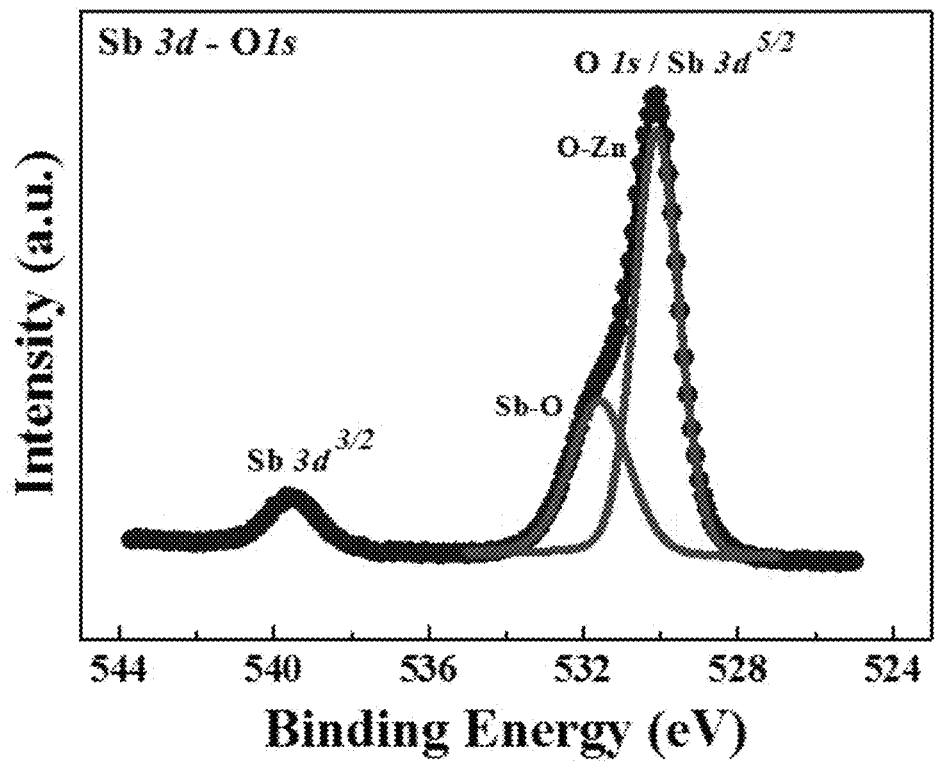

Referring to FIG. 4C, the core level XPS spectra associated with oxygen (O) is and Sb $3d^{5/2}$ overlap each other. The prominent peaks of oxygen (O) is and Sb $3d^{5/2}$ are deconvoluted, and it seems that the main peak at a binding energy of 530.1 eV is attributed to oxygen (O) atoms bound to Zn in a zinc oxide lattice. Furthermore, it seems that adjacent shoulder peaks at a binding energy of 531.6 eV may be attributed to presence or absence of antimony (Sb) atoms bound to oxygen (O) atoms instead of Zn. However, since the $Sd^{5/2}$ peak overlaps with the oxygen (O) 1s peak, clarification may be necessary.

Figure 4D:
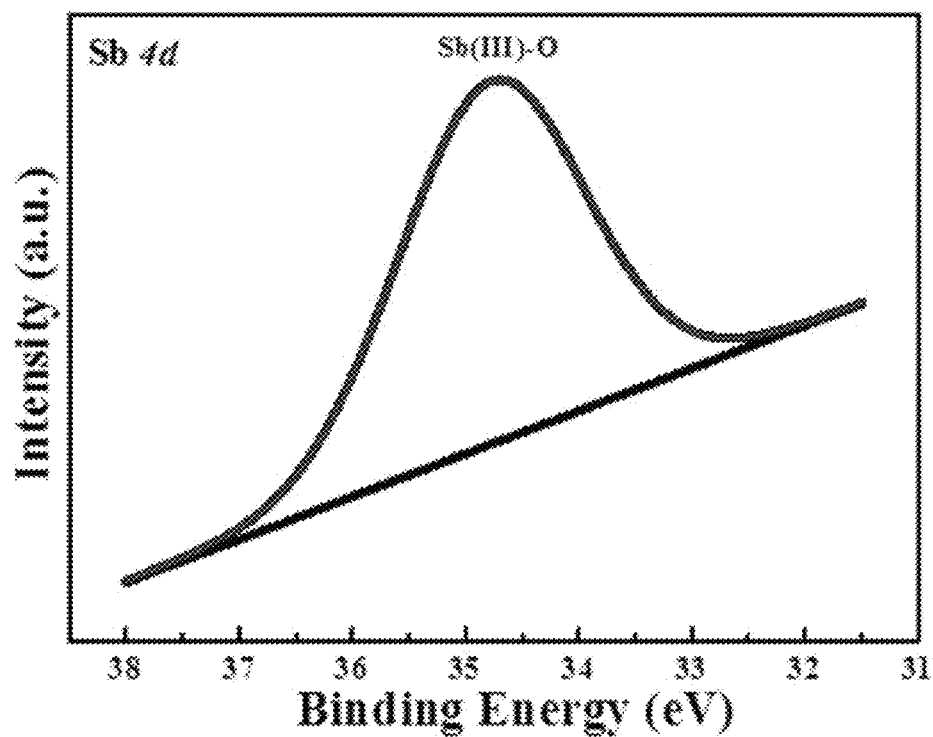

FIG. 4D shows a narrow-scan XPS spectrum of Sb 4d. Referring to FIG. 4D, a prominent peak appears at a binding energy of about 34.7 eV due to Sb(III) atoms bound to oxygen (O) atoms in a zinc oxide lattice.

As described above, the deficiency of metallic antimony (Sb) in the XPS spectrum shows that dopants were appropriately doped into a zinc oxide lattice by a low-temperature solution method. Therefore, the XPS spectral analysis may imply formation of a $(Sb_{Zn}-2V_{Zn})$ acceptor complex that results P-type conductivity in the nano-discs of zinc oxide doped with antimony (Sb). Generally, nano-discs of zinc oxide heavily doped with antimony (Sb) may have P-type conductivity due to the $(Sb_{Zn}-2V_{Zn})$ acceptor. Large-sized-mismatched antimony (Sb) atoms may replace Zn atoms and two zinc vacancies $V_{Zn}$ may be consequently formed to stabilize the zinc oxide lattice system. The formation of the complex may be expressed as shown in Formula 1 below.

$$Sb_{Zn}^{3+}+V_{Zn}^{2-}\rightarrow(Sb_{Zn}-V_{Zn})^{+}$$

$$(Sb_{Zn}-V_{Zn})^{+}+V_{Zn}^{2-}\rightarrow(Sb_{Zn}-2V_{Zn})^{-} \quad \text{[Formula 1]}$$

Figure 5:
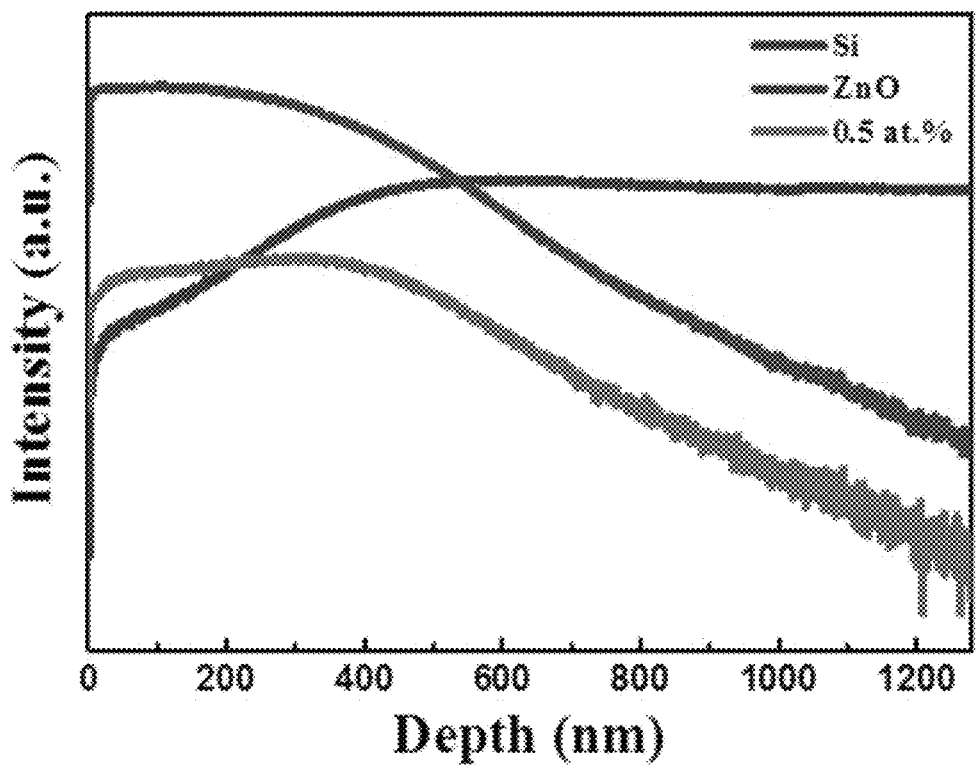
FIG. 5 is a graph showing a depth profile of antimony (Sb) atoms in nano-crystals of zinc oxide according to an embodiment of the present invention.

FIG. 5 is a graph showing a depth profile of antimony (Sb) atoms in nano-crystals of zinc oxide when the atomic concentration of antimony (Sb) is 0.5% of the atomic concentration of zinc according to an embodiment of the present invention. The depth profile of antimony (Sb) atoms in nano-crystals of zinc oxide may be measured by time-of-flight secondary ion mass spectrometry (TOF-SIMS).

Referring to FIG. 5, zinc oxide and antimony atoms decrease as the depth increases, but antimony (Sb) atoms are uniformly present in nano-crystals of zinc oxide. For example, when the nano-discs zinc oxide doped with antimony (Sb) are etched to gradually reduce the thickness thereof, antimony (Sb) atoms still appear in the nano-disc. The distribution of antimony (Sb) atoms may be uniform even when the atomic concentration of antimony (Sb) is increased to 2.0% of the atomic concentration of zinc, which is not shown.

Figure 6A:
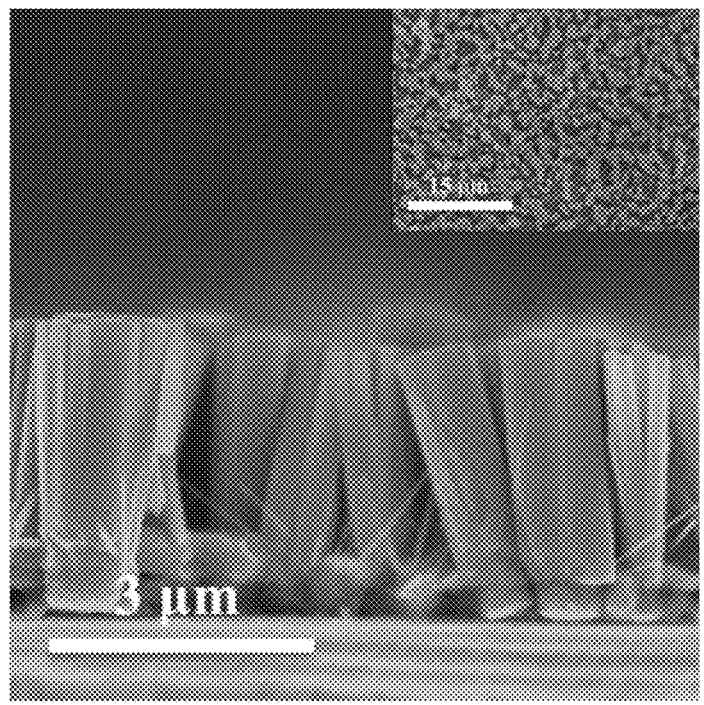
FIG. 6A is a SEM image of nano-rods of zinc oxide grown vertically on a monolayer of nano-discs of zinc oxide according to an embodiment of the present invention.

FIG. 6A is a SEM image of nano-rods of zinc oxide grown vertically on a monolayer of nano-discs of zinc oxide according to an embodiment of the present invention.

Referring to FIG. 6A, nano-rods of N-type zinc oxide having lengths of about 2.7 μm are vertically grown on a monolayer of nano-discs of P-type zinc oxide doped with antimony (Sb). FIG. 6A also shows uniform and dense growth of the nano-rods of the N-type zinc oxide on the nano-discs of the P-type zinc oxide doped with antimony (Sb).

Figure 6B:
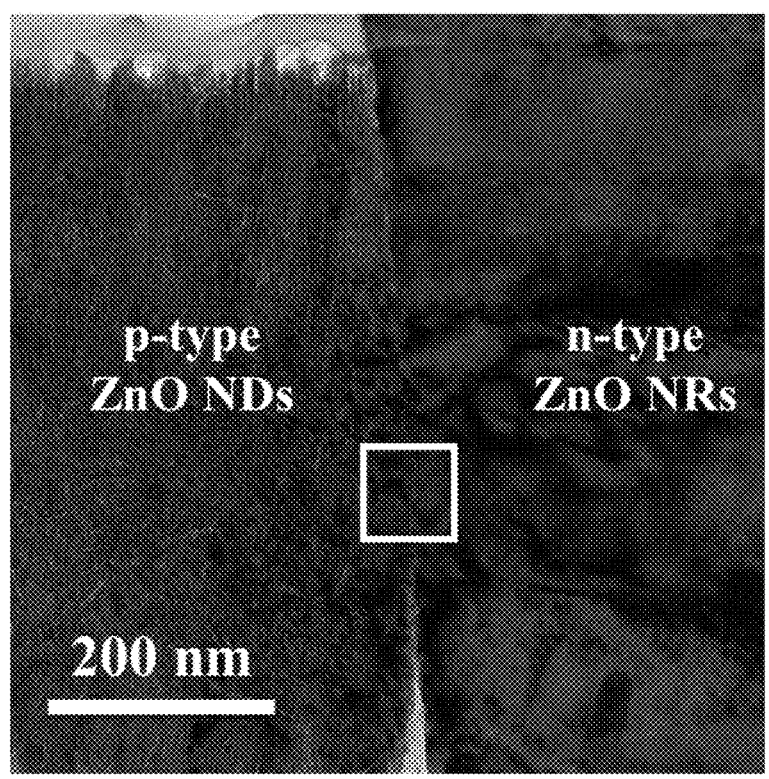
FIG. 6B is a low-magnification TEM image showing the interface between nano-discs of zinc oxide and nano-rods of zinc oxide according to an embodiment of the present invention.

FIG. 6B is a low-magnification TEM image showing the interface between nano-discs of zinc oxide and nano-rods of zinc oxide according to an embodiment of the present invention.

Referring to FIG. 6B, the interface between the nano-rods of the N-type zinc oxide and the nano-discs of the P-type zinc oxide may be formed by epitaxial growth of the nano-rods of the N-type zinc oxide on the nano-discs of the P-type zinc oxide. Furthermore, the interface between the nano-rods of N-type zinc oxide and the nano-discs of P-type zinc oxide may include homojunctions. The homojunctions may include same atoms or same alloy compositions, but may have different conductivities of doping levels.

Conventionally, a separate process for growing nano-rods of N-type zinc oxide on an independent seed layer and then bonding the grown nano-rods of N-type zinc oxide to the nano-rods of P-type zinc oxide is performed. However, according to the present invention, nano-rods of N-type zinc oxide are directly grown on nano-discs of the P-type zinc oxide, and thus a separate and additional bonding process is not required.

Figure 6C:
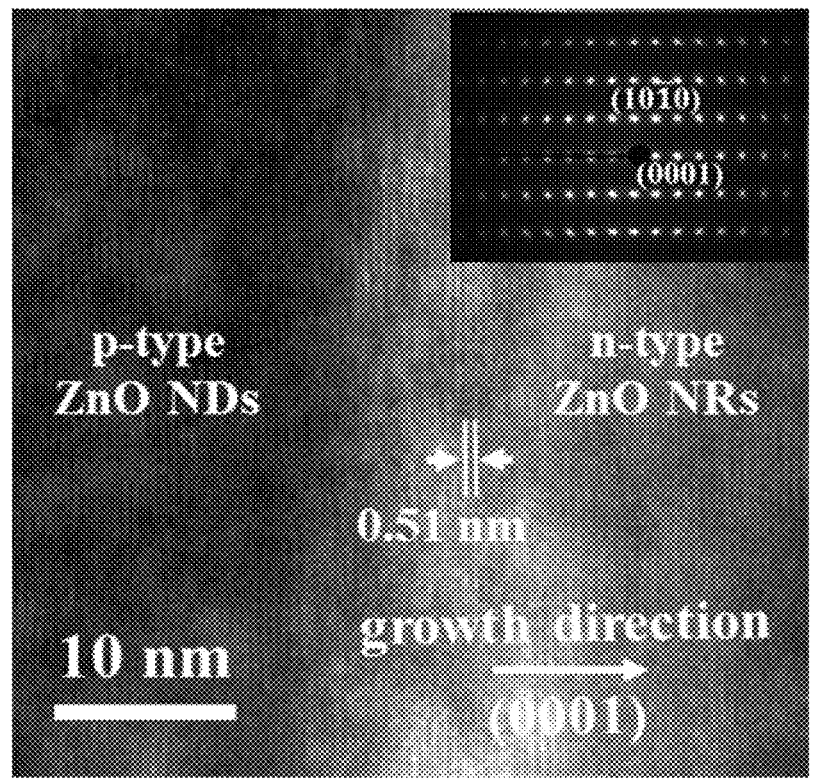
FIG. 6C is a HRTEM image showing epitaxial growth of nano-rods of zinc oxide on nano-discs of zinc oxide according to an embodiment of the present invention.

FIG. 6C is a HRTEM image showing epitaxial growth of nano-rods of zinc oxide on nano-discs of zinc oxide according to an embodiment of the present invention. FIG. 6C is a HRTEM image showing a portion of FIG. 6B in closer detail.

Referring to FIG. 6C, a continuous lattice pattern appearing at the interface between the nano-rods of N-type zinc oxide and the nano-discs of P-type zinc oxide shows that the nano-rods of N-type zinc oxide are epitaxially grown on the nano-discs of P-type zinc oxide doped with antimony (Sb) in the [0002] direction. The interplanar lattice spacing of about 0.51 nm in the nano-rods of zinc oxide shows that the nano-rods of the zinc oxide are grown along the [0001] direction coincident with the crystallization direction of the nano-discs of the zinc oxide doped with antimony (Sb). The SAED pattern of the interface shows the epitaxial characteristic of homojunction.

Figure 7A:
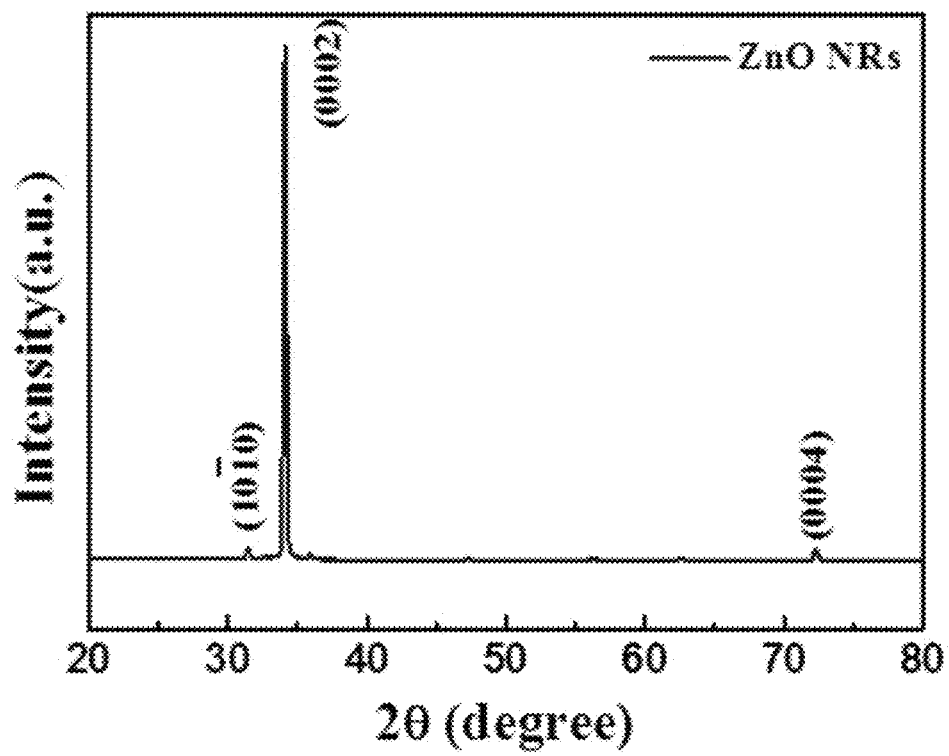
FIG. 7A is a graph showing XRD spectra of nano-rods of zinc oxide grown along the c-axis according to an embodiment of the present invention.

FIG. 7A is a graph showing XRD spectra of nano-rods of zinc oxide grown along the c-axis according to an embodiment of the present invention. To utilize the waveguide properties of the nano-rods, it is necessary to grow the nano-rods vertically with single crystallinity.

Referring to FIG. 7A, the XRD pattern of vertically grown nano-rods shows that the nano-rods of zinc oxide are grown in the [0002] direction. In other words, due to the excellent structural characteristics of nano-rods of zinc oxide, nano-discs of zinc oxide doped with antimony (Sb) may be used as a template for growth of nano-rods.

Figure 7B:
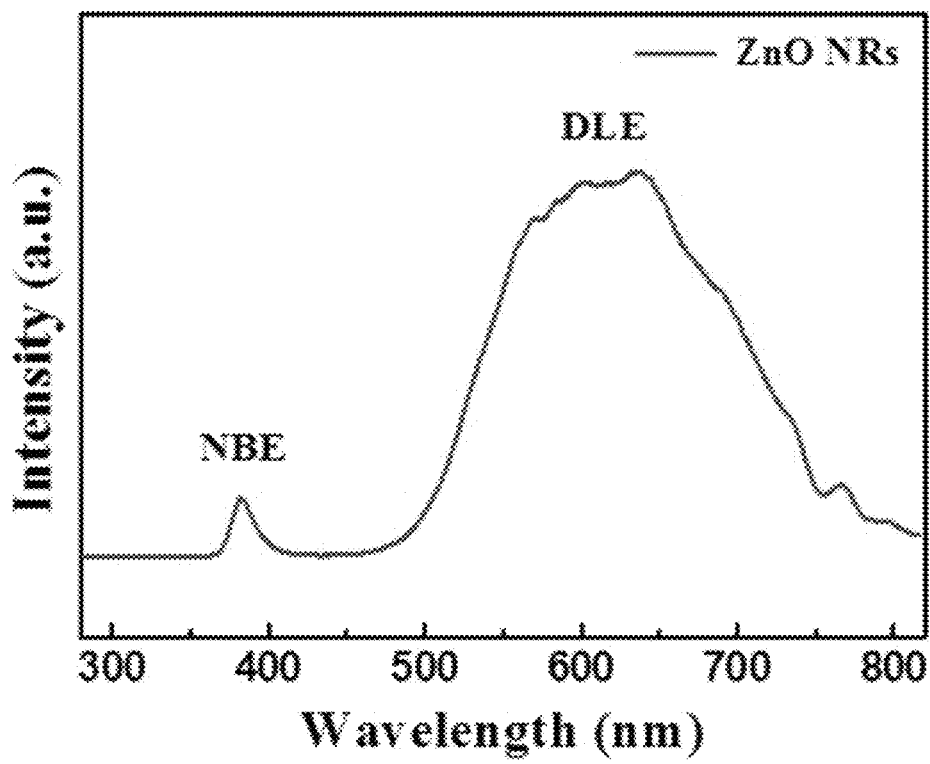
FIG. 7B is a graph showing a photoluminescence (PL) spectra of nano-rods of zinc oxide according to an embodiment of the present invention.

FIG. 7B is a graph showing a photoluminescence (PL) spectra of nano-rods of zinc oxide according to an embodiment of the present invention.

Referring to FIG. 7B, a strong DLE characteristic appears at a peak of about 620 nm, and a DLE characteristic appears throughout a broad range of wavelengths in the visible ray domain. Furthermore, a weak NBE characteristic appears at a peak of about 382 nm, and a NBE characteristic may be exhibited in a range narrower than that of the DLE characteristic in the visible ray domain. Here, intense DLE characteristic in a broad range of wavelengths in the visible ray domain indicates the presence of inherent defects of nano-rods of zinc oxide. Therefore, inherent point defects located deep inside a bandgap facilitate easy charge transitions to defective levels instead of direct band-to-band transitions.

Figure 8A:
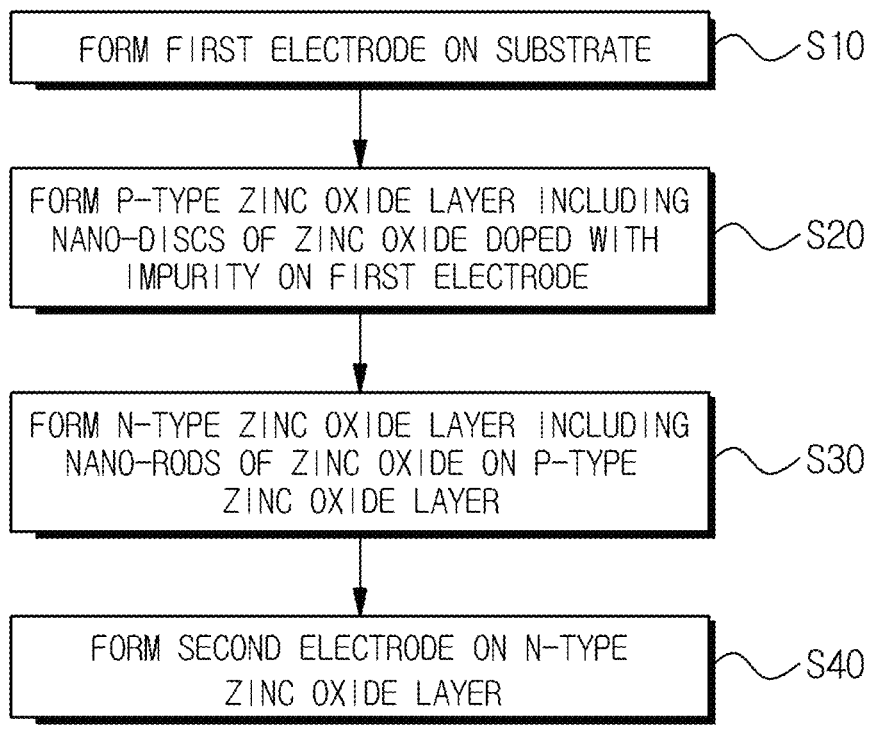
FIG. 8A is a flowchart of a method of fabricating a light-emitting diode according to an embodiment of the present invention.

FIG. 8A is a flowchart of a method of fabricating a light-emitting diode according to an embodiment of the present invention.

Referring to FIG. 8A, the method of fabricating a light-emitting diode may include forming a first electrode on a substrate (Step S10), forming a P-type zinc oxide layer including nano-discs of zinc oxide doped with an impurity on the first electrode (Step S20), forming an N-type zinc oxide layer including nano-rods of zinc oxide on the P-type zinc oxide layer in order to form a homojunction having an epitaxial interface (Step S30), and forming a second electrode on the N-type zinc oxide layer (Step S40). In other example, instead of the P-type zinc oxide layer including nano-discs of zinc oxide, a P-type zinc oxide layer including nano-rods of zinc oxide may be formed, and then, the N-type zinc oxide layer including nano-rods of zinc oxide may be epitaxially grown on a P-type zinc oxide layer. In another example, the order of the N-type zinc oxide layer and P-type zinc oxide layer is reversed to the fore-mentioned order.

The method of fabricating a light-emitting diode may further include an operation (not shown) for synthesizing the nano-discs of the zinc oxide doped with the impurity before the Step S20. The operation for synthesizing the nano-discs may include preparing a zinc precursor and a P-type dopant precursor, providing a first mixture by mixing the zinc precursor with the P-type dopant precursor, and reacting the first mixture in a high-pressure reactor. The operation for synthesizing the nano-discs may further include adding a structure-inducing agent to the first mixture to further provide a second mixture. Furthermore, the operation for synthesizing the nano-discs may further include cooling a reacted material by using the high-pressure reactor, collecting precipitates, for example, white precipitates including the nano-discs from the cooled reacted material by using a centrifuge device, and obtaining the nano-discs by washing the collected precipitates, for example, white precipitates.

The zinc precursor may include any one of zinc acetate dehydrate, zinc chloride, zinc nitrate hexahydrate, and combinations thereof. However, the zinc precursor according to the present invention is not limited thereto. The P-type dopant precursor may be a precursor including any one of antimony (Sb), arsenic (As), phosphorus (P), and bismuth (Bi). For example, according to an embodiment of the present invention, the P-type dopant precursor may be antimony (III) acetate [$Sb(CH_3CO_2)_3$]. However, the P-type dopant precursor according to the present invention is not limited thereto. The structure inducing agent includes any one of sodium hydroxide (NaOH), potassium hydroxide (KOH), ammonium hydroxide ($NH_4OH$), and combinations thereof. However, the structure inducing agent according to the present invention is not limited thereto. The structure inducing agent may be used for adjusting pH of a mixed solution of a zinc precursor and a dopant precursor.

According to an embodiment of the present invention, nano-discs of P-type zinc oxide doped with antimony (Sb) may be synthesized. For example, the nano-discs of zinc oxide doped with antimony (Sb) may be synthesized via a hydrothermal reaction by using a stainless steel autoclave coupled with Teflon having a capacity of about 50 mL. Here, zinc acetate dehydrate (about 2.5 mmol) and trisodium citrate dehydrate (about 0.8 mmol) may be used as a zinc precursor and a structure inducing agent, respectively, and antimony acetate (Antimony III) acetate) [$Sb(CH_3CO_2)_3$] may be selected as a P-type dopant (Sb) precursor. And the atomic concentration of antimony (Sb) may be controlled to, for example, 0.5%, 1%, 1.5%, and 2% of the atomic concentration of zinc. All of the above-stated reagents are separately dissolved in 10 mL of de-ionized (DI) water (approximately 18.25 MΩ (millipore)). Next, the reagents dissolved in the DI water are mixed with one another. The final volume of an aqueous solution may be 40 mL. According to some embodiments, all of the above-stated reagents may be simultaneously dissolved in 40 mL of DI water and mixed with one another.

Here, 2 M of sodium hydroxide (NaOH) may be slowly added until pH of a solution prepared by using a pH meter (e.g., SP-2300, Suntex) becomes about 9.0. 40 mL of the final solution may be transferred into an autoclave reactor and maintained in an oven at a temperature of about 120° C. for about 8 hours. After the reaction, the autoclave reactor may be spontaneously cooled at the room temperature. The nano-discs of the P-type zinc oxide doped with antimony (Sb) including white precipitates are collected by a centrifuge device and may be successively washed about three times with DI water and anhydrous ethanol.

According to an embodiment of the present invention, the forming the P-type zinc oxide layer may further include providing a dispersion solution having dispersed therein the nano-discs of zinc oxide; dripping the dispersion solution onto a surface of a base material (e.g., water, distilled water, etc.) to form a two-dimensional monolayer including the nano-discs of zinc oxide on the surface of water; and transferring the two-dimensional monolayer of the nano-discs of zinc oxide formed on the surface of water onto the first electrode. Here, an operation for performing heat treatment on the first electrode and the P-type zinc oxide layer may be further included after the transferring operation. The dispersion solution may include any one of water, alcohol, methanol, ethanol, propanol, isopropanol, butanol, and mixtures thereof. The dispersion solution including the nano-discs of zinc oxide is defined as a solution of nano-discs of P-type zinc oxide dispersed in the dispersion solution.

According to an embodiment of the present invention, the forming of the N-type zinc oxide layer may include filling gaps between the nano-discs with an insulator; and growing the nano-rods on the top surfaces of the nano-discs by using a hydrothermal method.

According to an embodiment of the present invention, in order to synthesize un-doped nano-rods of N-type zinc oxide on a monolayer of doped nano-discs of P-type zinc oxide, a hydrothermal synthesizing method may be performed at an optimal temperature of about 95° C. and a reaction time of about 4 hours. The nano-discs of the P-type zinc oxide doped with antimony (Sb) may be dipped into a chemical bath containing an aqueous solution of about 20 mM of zinc acetate dehydrate including a same concentration of hexamethylenetetramine (HMTA). After the reaction is completed, samples may be washed with DI water and dried on a hot plate at 110° C. for 10 minutes.

According to an embodiment of the present invention, the operation for forming the second electrode may include filling gaps between the nano-rods with an electrical insulator; and forming the second electrode on the top surfaces of the nano-rods. The electrical insulator may include a nonconductive photoresist (PR). However, the insulator according to the present invention is not limited thereto.

According to an embodiment of the present invention, the substrate may be a glass substrate, and the glass substrate may be washed via successive ultrasonications in acetone, methanol, and DI water for about 10 minutes each. A metal (e.g., gold (Au)) layer having thickness of 100 nm for contacting with underlining structures may be formed on the washed glass substrate by using an electron beam evaporator. Furthermore, a self-assembled monolayer (SAM) may be used to obtain nano-discs of P-type zinc oxide doped with antimony (Sb). Here, the monolayer of the nano-discs of the P-type zinc oxide may be formed at the air-water interface and may be successively transferred to the glass substrate coated with the metal (e.g., Au). Next, the nano-discs of the P-type zinc oxide formed on the glass substrate coated with the metal (e.g., Au) may be heat-treated at a temperature of about 250° C. for about 1 hour on a hot plate in an air ambience. Next, a nonconductive photoresist (PR) may be spin-coated in order to fill gaps between the nano-discs of the P-type zinc oxide. A PR layer on the nano-discs of the P-type zinc oxide may be dry-etched by using oxygen plasma of about 150 W in a reactive ion etching (RIE) chamber. Next, nano-rods including the N-type zinc oxide may be grown homoepitaxially on the nano-discs of the P-type zinc oxide. PR molding and etching operations may be repeated in order to place a top connection electrode. Finally, an indium zinc oxide (IZO)-Ag-IZO electrode constituting an oxide-metal-oxide (OMO) multilayer corresponding to a thickness of 40-12-40 nm may be formed at the room temperature via a thin-film deposition process by using a dot-patterned shadow mask having the dot diameter of 550 µm.

Figure 8B:
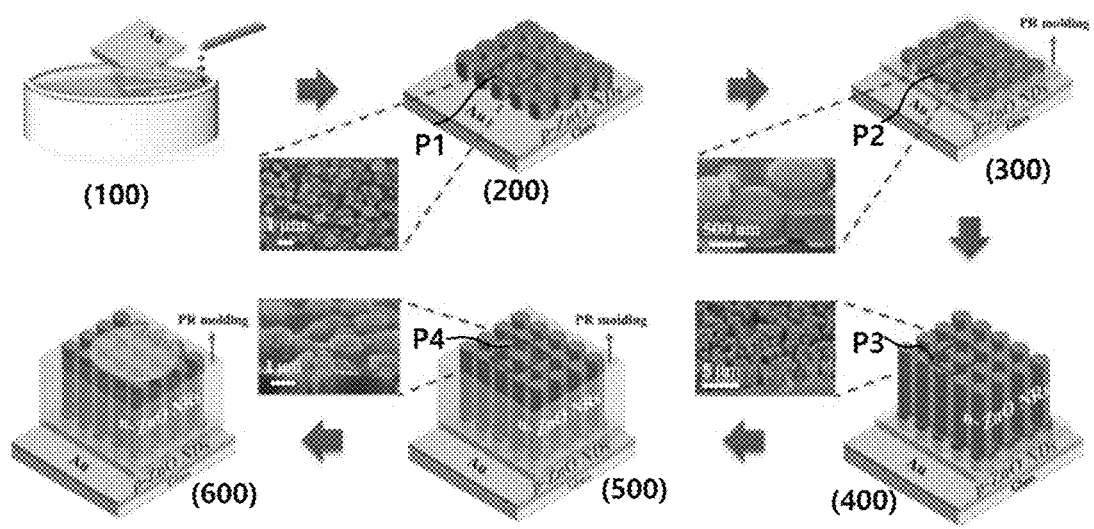
FIG. 8B is a diagram showing a method of fabricating a light-emitting diode according to an embodiment of the present invention.

FIG. 8B is a diagram showing a method of fabricating a light-emitting diode according to an embodiment of the present invention.

Referring to FIG. 8B, a monolayer of doped nano-discs of zinc oxide may be prepared at the air-water interface (100) and may be successively transferred onto a surface of a glass substrate laminated with a gold (Au) layer having the thickness of 100 nm (200). The glass substrate may be washed via successive ultrasonications in acetone, methanol, and DI water for 10 minutes each. Here, the metal (e.g., gold (Au)) layer having the thickness of 100 nm for contacting underlying structures may be formed on the washed glass substrate by using an electron beam evaporator, for example.

According to an embodiment of the present invention, a solution of the P-type zinc oxide nano-disc dispersed in 1-butanol is slowly injected into a container containing DI water using a drop method. As the solution spreads onto the water surface, nano-discs of p-type zinc oxide of a two-dimensional monolayer may be formed at the air-water interface (100). At this time, the nano-discs may be carefully transferred onto the Au-coated glass substrate (or electrode) (200). The SEM image P1 is a SEM image of some of nano-discs transferred onto the Au0coated glass substrate.

Next, gaps between the nano-discs may be filled with an insulator (e.g., a nonconductive photoresist) as an encapsulating agent in order to prevent electrical short-circuit between gold (Au) and the P-type zinc oxide (300). Here, the insulator above the nano-discs may be dry-etched by using reactive oxygen ions in order to grow nano-rods of zinc oxide. The SEM image P2 shows a mold arrangement of nano-discs of zinc oxide doped with antimony (Sb) after dry etching. Next, in order to form PN homojunction, nano-rods of undoped zinc oxide are grown on exposed surfaces of an array of the nano-discs of zinc oxide at a temperature of about 95° C. for about 4 hours (400) (refer to Step S30 of FIG. 8A). The SEM image P3 shows surfaces of the nano-rods of the grown N-type zinc oxide.

Next, a molding and etching operations may be repeated in order to deposit a top electrode (500). The SEM image P4 shows exposed surfaces of the nano-rods of zinc oxide prior to deposition of a top electrode material. In order to fabricate a high-performance surface-emitting LED, a transparent IZO-Ag-IZO OMO electrode may be used as the top electrode material. After optimization of the thickness of the IZO-Ag-IZO layer to 40-12-40 nm, an excellent transmittance of 87.7% in the visible ray domain with a low sheet resistance of 5.65Ω/□ may be achieved. A homojunction structure including the nano-rods of N-type zinc oxide/the nano-discs of P-type zinc oxide with the transparent top OMO electrode may be obtained (600).

As described above, a light-emitting diode having homojunction may be fabricated by using a monolayer of nano-discs of P-type zinc oxide doped with antimony (Sb) as a template for growth of nano-rods of undoped N-type zinc oxide.

Figure 9A:
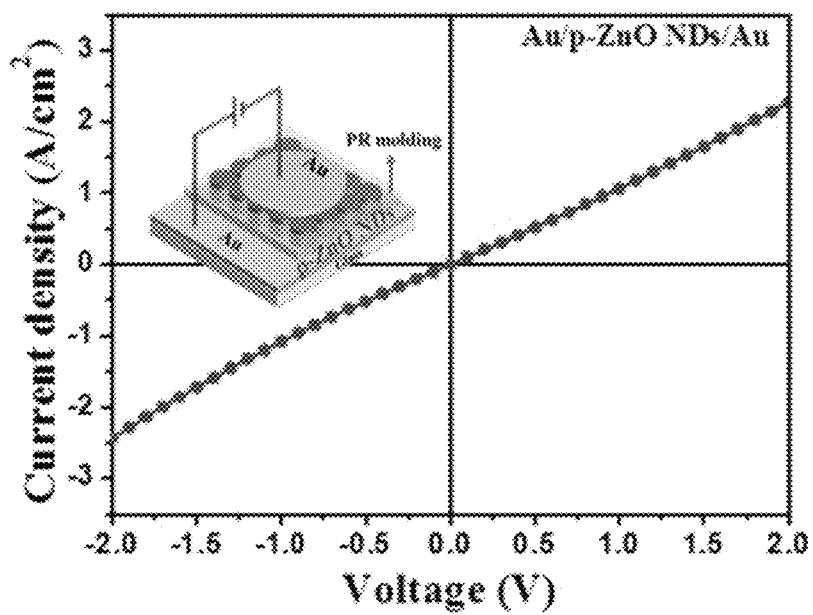
FIGS. 9A through 9C are graphs showing current density-voltage characteristics of a light-emitting diode according to an embodiment of the present invention.
Figure 9B:
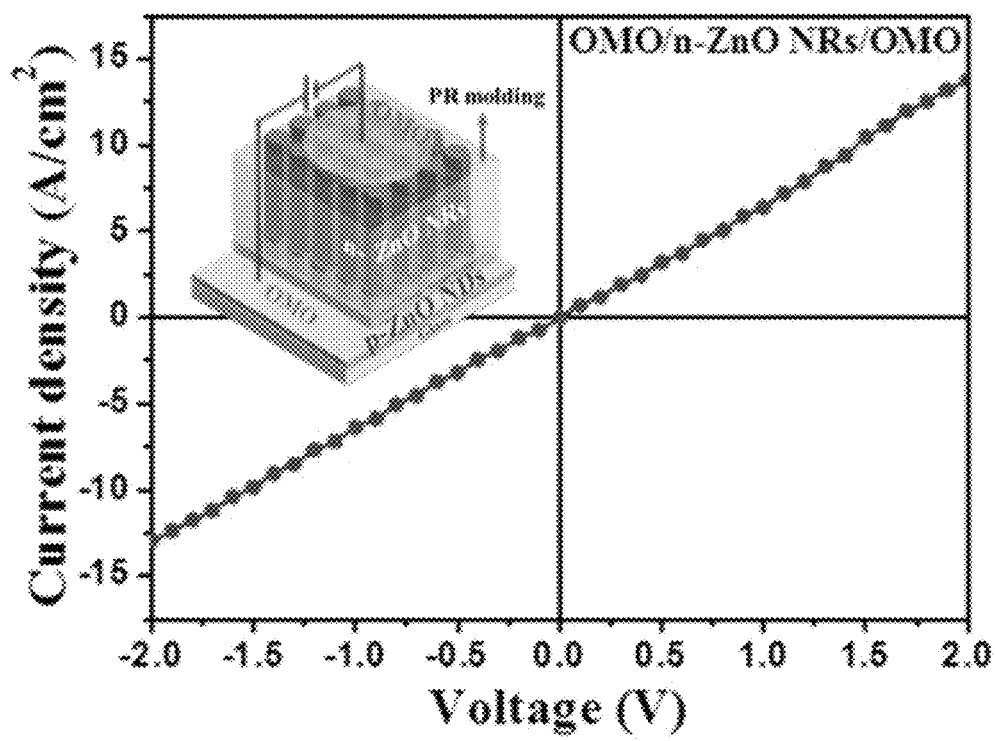
Figure 9C:
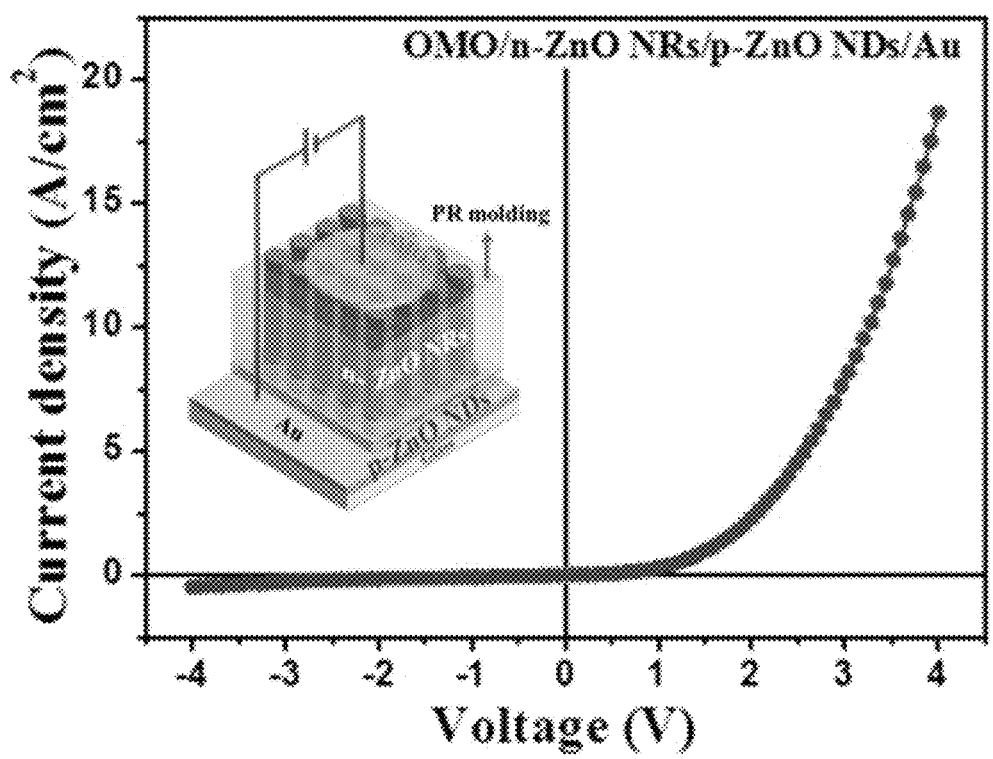

FIGS. 9A through 9C are graphs showing current density-voltage (J-V) characteristics of a light-emitting diode according to an embodiment of the present invention. FIG. 9A is a diagram showing current density-voltage (J-V) characteristics in an electrode-semiconductor-electrode (ESE) structure including gold (Au)—nano-discs of zinc oxide—gold (Au), FIG. 9B is a diagram showing current density-voltage (J-V) characteristics in an ESE structure including OMO—nano-rods of zinc oxide—OMO, and FIG. 9C is a diagram showing current density-voltage (J-V) characteristics in an ESE structure including OMO—nano-rods of N-type zinc oxide—nano-discs of P-type zinc oxide—gold (Au). Here, the J-V curves represent the ohmic characteristics of electrode semiconductor contacts.

Referring to FIG. 9A, the P-type conductivity of nano-discs clearly appears in the ohmic contact between a gold (Au) electrode and nano-discs of zinc oxide doped with an impurity (e.g., antimony (Sb)). The ohmic contact of FIG. 9A exhibits a characteristic in which the current density increases in proportion to intensity of a voltage.

Referring to FIG. 9B, the N-type conductivity of the nano-rods clearly appears in the ohmic contact between an OMO electrode and nano-rods of zinc oxide. The ohmic contact of FIG. 9B exhibits a characteristic in which the current density increases in proportion to intensity of a voltage.

Referring to FIG. 9C, in the ESE structure including OMO—nano-rods of N-type zinc oxide—nano-discs of P-type zinc oxide—gold (Au), the turn-on voltage is about 2.5 V. At a measured current level corresponding to a voltage of 4 V, a high current density of about 18.66 A/cm2 may be obtained.

Figure 10A:
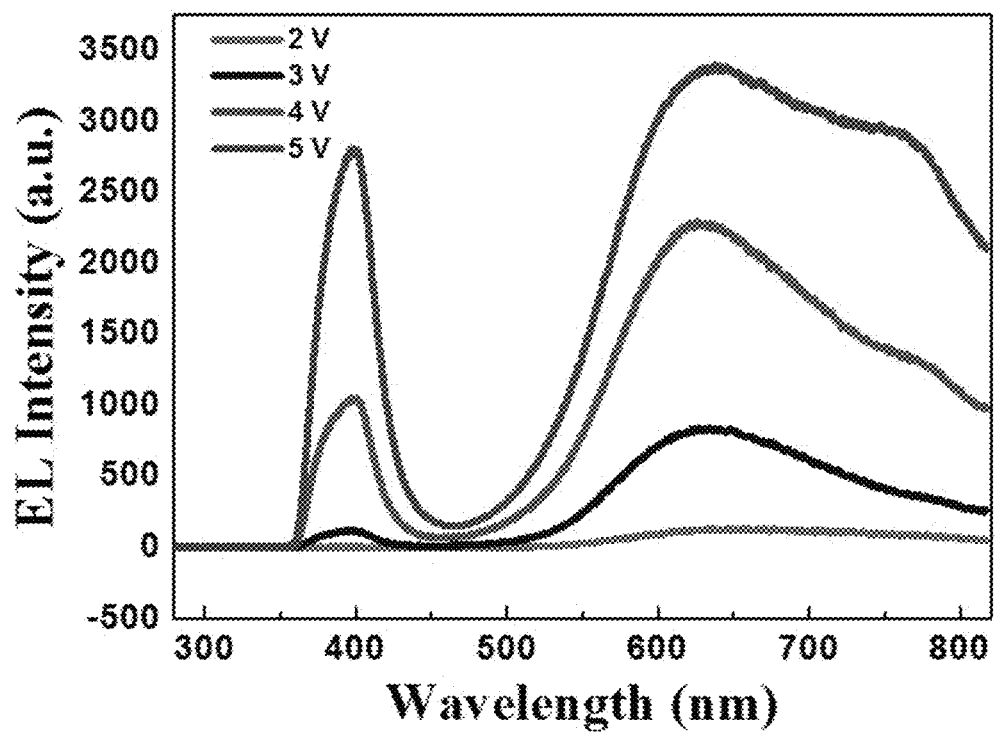
FIG. 10A is a graph showing the electroluminescence (EL) spectra of a light-emitting diode according to an embodiment of the present invention.

FIG. 10A is a graph showing the electroluminescence (EL) spectra of a light-emitting diode according to an embodiment of the present invention. FIG. 10A shows EL spectra of a homojunction diode (e.g., the light-emitting diode of FIG. 1) including nano-discs of P-type zinc oxide doped with 0.5 at. % of antimony/nano-rods of N-type zinc oxide.

Referring to FIG. 10A, a forward bias from 2 V to 5 V may be supplied to the light-emitting diode. As the forward bias increases, the EL intensity also increases, and the EL intensity may represent a flow of charge carriers that facilitates easy radiative recombination.

Figure 10B:
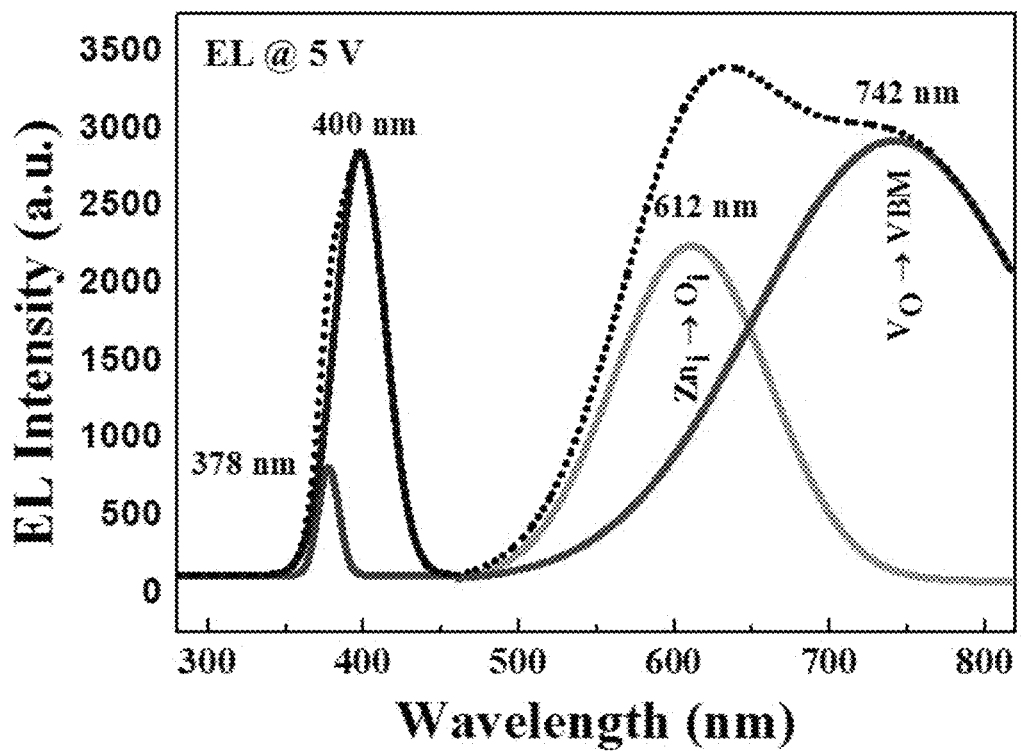
FIG. 10B is a graph showing the deconvoluted electroluminescence (EL) spectra of a light-emitting diode according to an embodiment of the present invention.

FIG. 10B is a graph showing the deconvoluted electroluminescence (EL) spectra of a light-emitting diode according to an embodiment of the present invention.

Referring to FIG. 10B, four peaks appear in the EL spectrum deconvoluted at the forward bias of 5 V. For example, the deconvoluted EL spectrum includes a peak with high energy emission at the wavelength of 378 nm, a peak at the wavelength of 400 nm, a peak at the wavelength of 612 nm corresponding to orange emission, and a peak at the wavelength of 742 nm related to red emission.

Figure 10C:
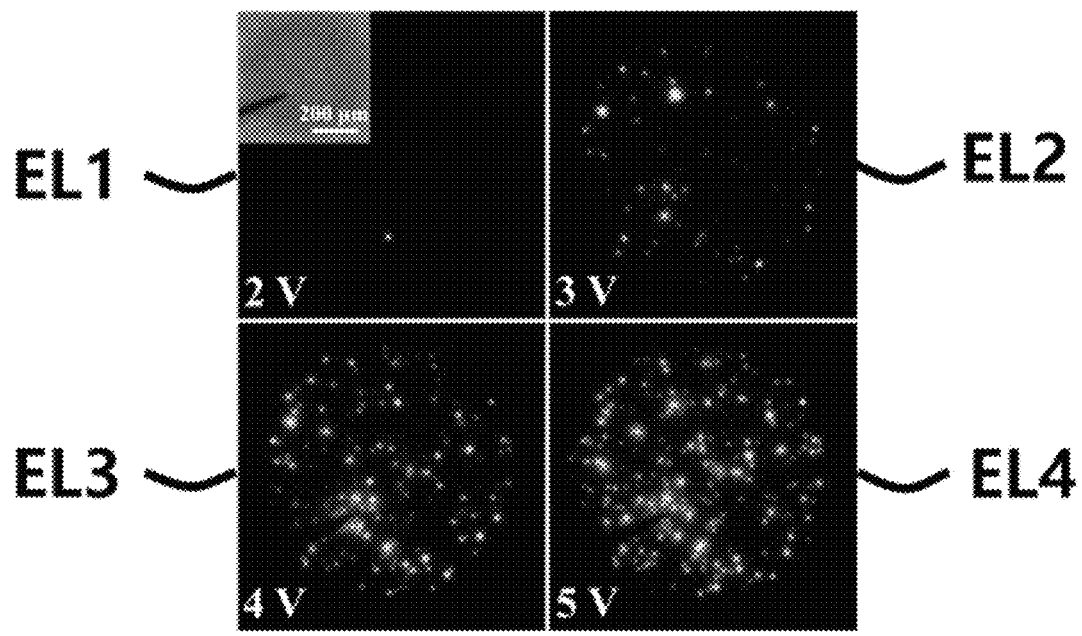
FIG. 10C is an image showing electroluminescence (EL) of a light-emitting diode according to an embodiment of the present invention.

FIG. 10C is an image showing electroluminescence (EL) of a light-emitting diode according to an embodiment of the present invention. EL1 through EL4 in FIG. 10C are optical microscopic (OM) images of a transparent top OMO electrode having a diameter of 550 µm.

EL1 is an electroluminescence (EL) image of the light-emitting diode when a forward bias of 2 V is supplied, EL2 is an electroluminescence (EL) image of the light-emitting diode when a forward bias of 3 V is supplied, EL3 is an electroluminescence (EL) image of the light-emitting diode when a forward bias of 4 V is applied, and EL4 is an electroluminescence (EL) image of the light-emitting diode when a forward bias of 5 V is supplied.

Referring to FIG. 10C, the light-emitting diode emits orange-red light due to a forward bias within a range from 2 V to 5 V. The emitted orange-red light may be seen by the naked eyes and is emitted very stably. According to the EL spectrum, the brightness of light may increase as DC forward bias increases. The phenomenon may be attributed to the large number of photons based on the increase of the DC forward bias. The brightness of the light-emitting diode is measured to 1.73 cd/m$^2$ under the DC forward bias of 5 V, and current efficiency corresponding thereto is calculated to 2.75×10$^{-6}$ cd/A.

Figure 10D:
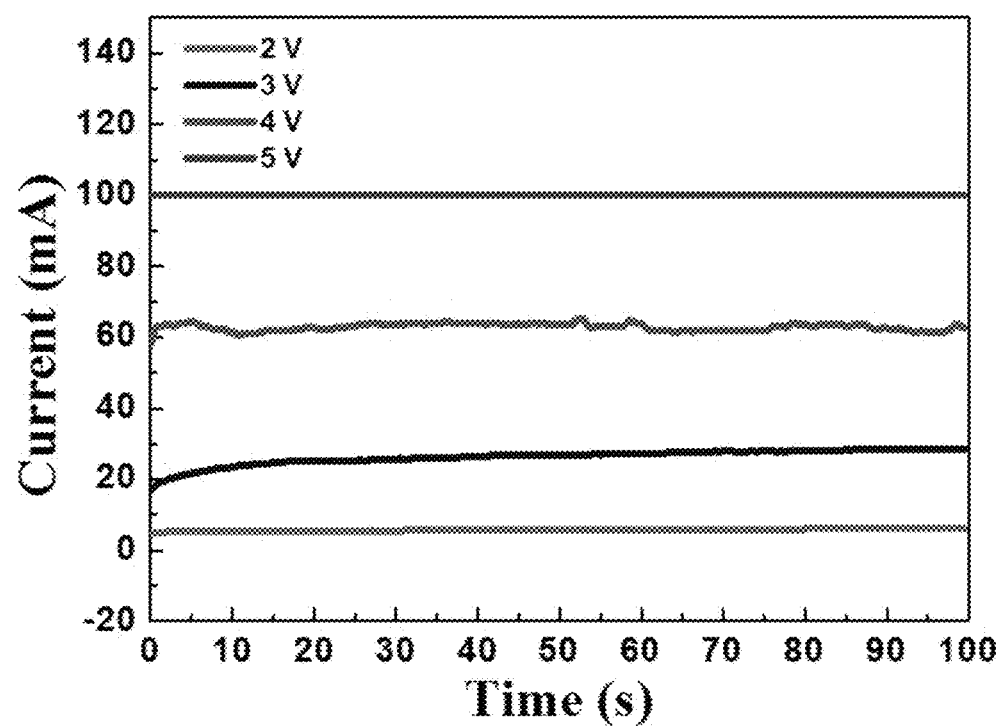
FIG. 10D is a graph showing a stability test of a light-emitting diode based on voltage stress according to an embodiment of the present invention.

FIG. 10D is a graph showing a stability test of a light-emitting diode based on voltage stress according to an embodiment of the present invention. FIG. 10D shows results of stability tests of a light-emitting diode under various forward biases from 2 V to 5 V for 100 seconds.

Referring to FIG. 10D, currents are very stable over the entire operation period regardless of amounts of the currents injected into the light-emitting diode. For example, currents due to the forward biases of 2 V, 3 V, 4 V, and 5 V were stably supplied for 100 seconds.

As described above, in order to verify effects of the shape and the crystallinity of doped P-type zinc oxide, PN homojunction light-emitting diodes including nano-discs of P-type zinc oxide doped with 0.5%, 1.0%, 1.5%, and 2% of the atomic concentration of antimony (Sb) were fabricated. As the atomic concentration of antimony (Sb) increases, the nano-discs of zinc oxide doped with antimony (Sb) exhibit higher surface roughness and lower crystallinity. As a result, the interface of the PN homojunction may be seriously degraded.

Figure 11:
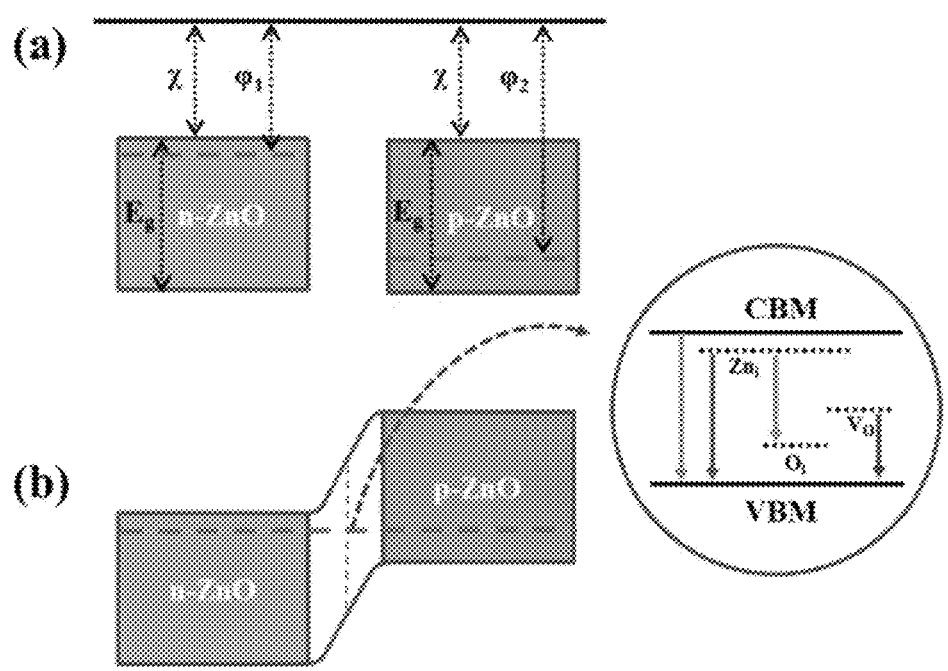
FIG. 11 is an energy band diagram of nano-discs of zinc oxide and nano-rods of zinc oxide according to an embodiment of the present invention.

FIG. 11 is an energy band diagram of nano-discs of zinc oxide and nano-rods of zinc oxide according to an embodiment of the present invention. FIG. 11 is an energy band diagram (a) of the nano-discs of zinc oxide and the nano-rods of zinc oxide before a junction having a band gap $E_g$, an electron affinity ($\chi$), and a relative work functions $\varphi_1$ and $\varphi_2$ is formed, whereas an energy band diagram (b) of the nano-discs of zinc oxide and the nano-rods of zinc oxide is shown after a junction having a band gap $E_g$, an electron affinity ($\chi$), and a relative work functions $\varphi_1$ and $\varphi_2$ is formed.

Referring to FIG. 11, in the PL spectrum of the nano-rods of zinc oxide, a small peak at the wavelength of 378 nm supported by NBE may be allocated to band-to-band transition. The dominant peak at the wavelength of 400 nm may be considered as a result of transition from the Zn interstitial ($Zn_i$) to the valence-band maximum (VBM). The energy level corresponding to the inherent $Zn_i$ defect may be located at 0.2 eV below the conduction-band minimum (CBM). The result may stimulate electrons for non-radiative transition from CBM rather than inter-band transition. The other peaks at the wavelengths of 612 nm and 742 nm in the visible ray domain may be attributed to transition from $Zn_i$ to the oxygen interstitial ($O_i$) or transition from oxygen vacancy ($V_O$) to the VBM.

As described above, according to an embodiment of the present invention, a light-emitting diode having homojunction between nano-rods of N-type zinc oxide and nano-discs of doped P-type zinc oxide may be successfully prepared via a low-temperature solution process. Nano-crystals of zinc oxide doped with about 0.5 at. % of antimony (Sb) may be grown along the c-axis with the shape of nano-discs used as a stand-alone template for epitaxial growth of nano-rods of zinc oxide. The XPS spectrum shows a ($Sb_{Zn}$–$2V_{Zn}$) acceptor complex in the nano-discs of zinc oxide. The nano-rods of undoped N-type zinc oxide grown directly on the nano-discs of P-type zinc oxide may appear in single crystal [0002] having epitaxial interfaces. The current-voltage characteristics of the zinc oxide (ZnO) homojunction have typical PN diode characteristics with a turn-on voltage of 2.5 V. Furthermore, the PN homojunction of the present invention is stable at different voltage stresses. Furthermore, in the EL spectrum of a light-emitting diode having the PN zinc oxide homojunction according to the present invention, together with an asymmetric high energy peak at a wavelength of about 400 nm, two main peaks appear at wavelengths of 612 nm and 742 nm in ranges of the visible ray domain corresponding to orange and red, respectively. It is assumed that defect of emission of visible ray is induced based on the PL spectrum of the nano-rods of zinc oxide. Furthermore, the peak at the wavelength of 612 nm may be attributed to transition from $Zn_i$ to $O_i$, whereas the peak at the wavelength of 742 nm is attributed to the transition from $V_O$ to VBM. The high energy peak around the wavelength of 400 nm is de-convoluted into two sub-peaks. In other words, the peak at the wavelength of 378 nm is related to the band-to-band transition, whereas the other peak at the wavelength of 400 nm may be attributed to the transition from $Zn_i$ to VBM.

Furthermore, a light-emitting diode having a PN zinc oxide (ZnO) homojunction according to the present invention may emit orange-red light under a forward bias of 5 V. The light is visible to the naked eyes. Therefore, the present invention may provide a method of fabricating a light-emitting diode having PN homojunction based on nano-crystals of zinc oxide using a low-cost by via a low-temperature solution process.

Figure 12:
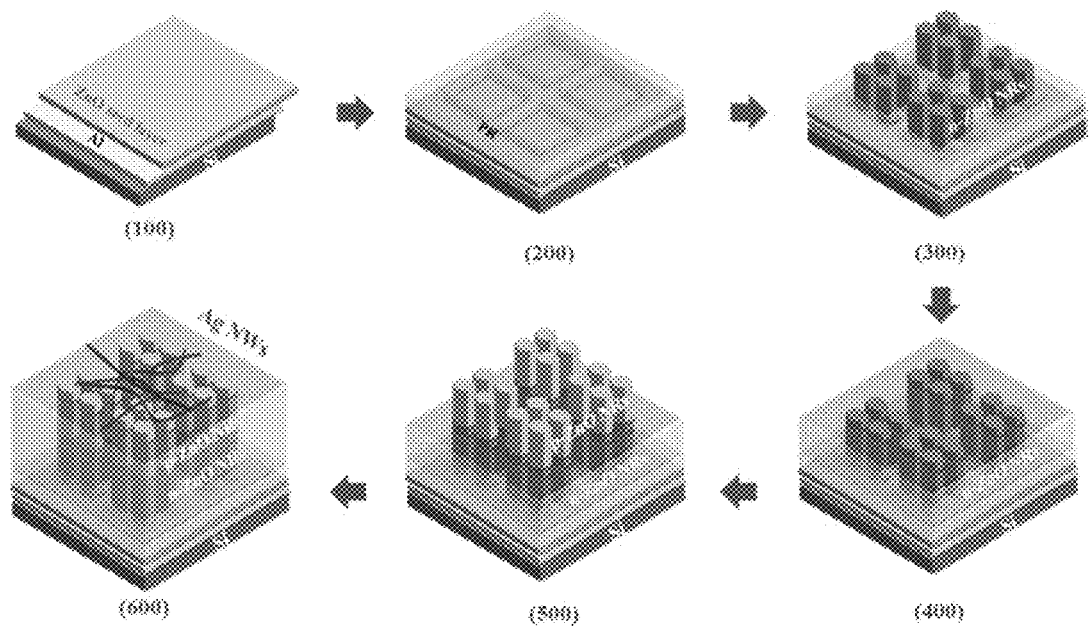
FIG. 12 is a diagram showing a method of fabricating a light-emitting diode according to another embodiment of the present invention.

FIG. 12 is a diagram showing a method of fabricating a light-emitting diode according to another embodiment of the present invention.

Referring to FIG. 12, the method may include forming an aluminum (Al) electrode and a zinc oxide seed layer on a silicon substrate (operation 100), forming a pattern having an opening region on the zinc oxide seed layer via photoresist (PR) patterning using photolithography (operation 200), growing nano-rods of N-type zinc oxide in the opening region of the pattern using a hydrothermal synthesizing method (operation 300), filling gaps between nano-rods of N-type zinc oxide (hereinafter referred to as PR molding) by using an electrical insulator, such as nonconductive photoresist, and performing etching until the top surfaces of the nano-rods of the grown N-type zinc oxide are exposed (operation 400), growing nano-rods of P-type zinc oxide doped with an impurity (e.g., antimony (Sb)) on the top surfaces of the nano-rods of the N-type zinc oxide exposed using the hydrothermal synthesizing method (operation 500), and filling gaps between nano-rods of P-type zinc oxide (PR molding) by using an electrical insulator, such as nonconductive photoresist, performing etching until the top surfaces of the nano-rods of the grown P-type zinc oxide are exposed, and depositing silver nano-wires on the exposed nano-rods of zinc oxide (operation 600).

As described above, nano-rods of P-type zinc oxide doped with an impurity may be grown on the grown nano-rods of N-type zinc oxide, and thus a light-emitting diode having homojunction may be fabricated. According to another embodiment, the operations 300 and 500 may be performed in the reversed order. For example, nano-rods of N-type zinc oxide may be grown on nano-rods of grown P-type zinc oxide doped with an impurity, thereby fabricating a light-emitting diode having homojunction. Here, a zinc oxide seed layer may be formed before the nano-rods of zinc oxide doped with an impurity are formed on the first electrode. The zinc oxide seed layer may be formed using an RF sputtering method. However, a method of forming the zinc oxide seed layer in the present invention is not limited to the RF sputtering method and other vapor deposition or plating method may be utilized. The zinc oxide seed layer may also help the nano-rods of zinc oxide to grow vertically on an electrode.

Figure 13A:
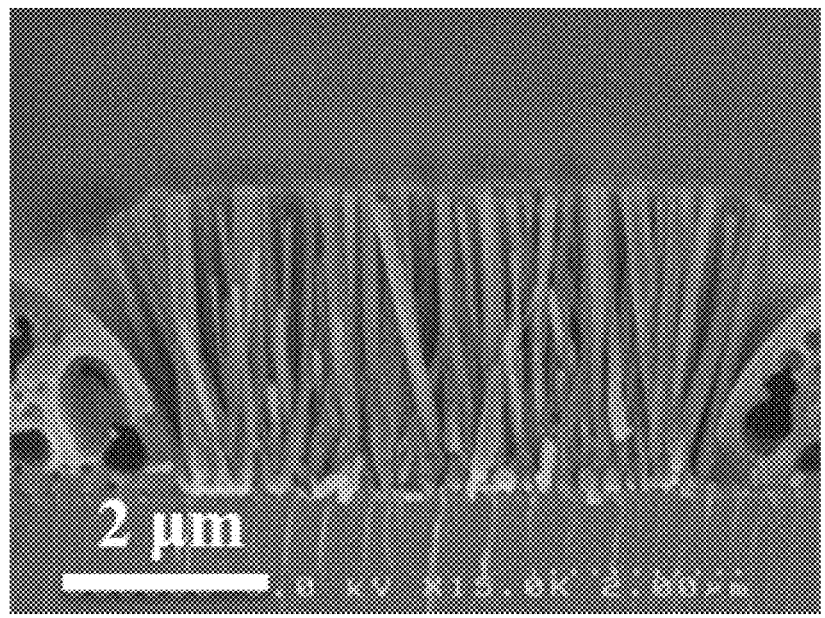
FIGS. 13A through 13B are SEM images of nano-rods of zinc oxide according to another embodiment of the present invention.
Figure 13B:
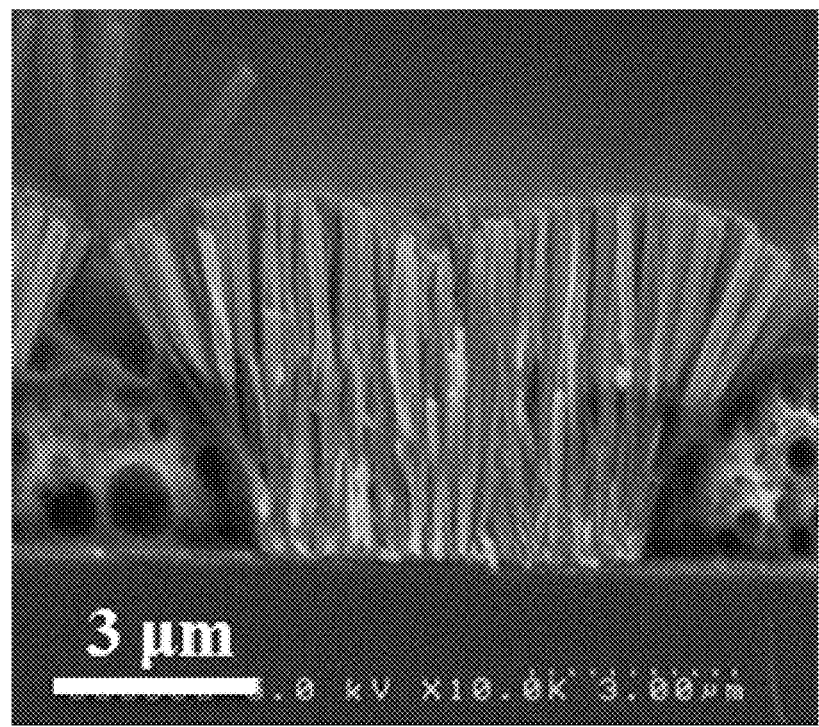

FIGS. 13A through 13B are SEM images of nano-rods of zinc oxide according to another embodiment of the present invention.

FIG. 13A is an SEM image of the nano-rods of N-type zinc oxide grown in the operation 300 of FIG. 12, and FIG. 13B is a SEM image of nano-rods of N-type zinc oxide grown on the top surfaces of the nano-rods of N-type zinc oxide doped with 0.5 at. % of antimony (Sb) in the operation 500 of FIG. 12.

Figure 14:
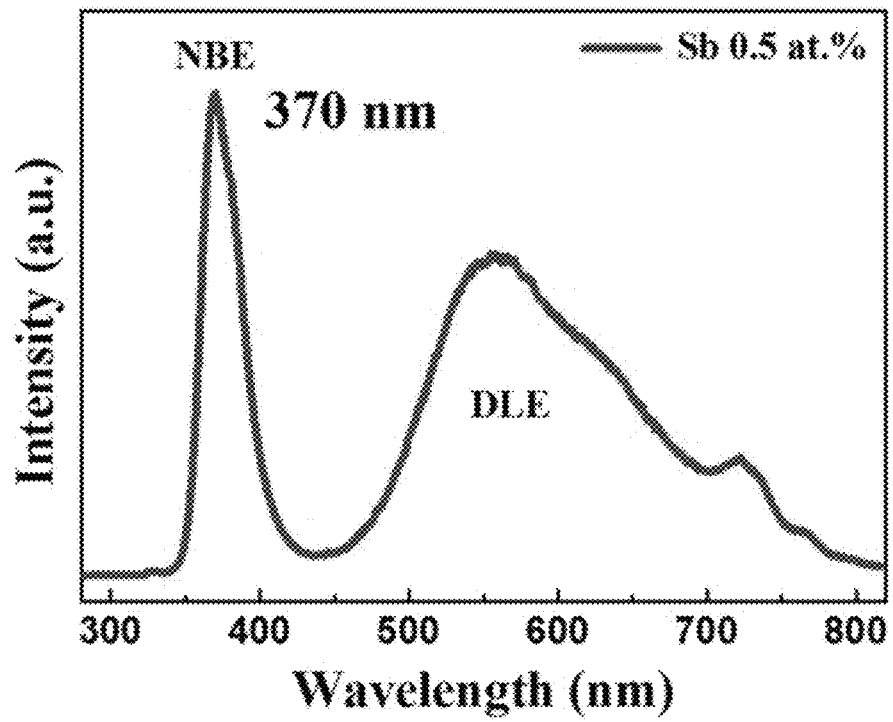
FIG. 14 is a graph showing a photoluminescence (PL) spectra of nano-rods of zinc oxide according to another embodiment of the present invention.

FIG. 14 is a diagram showing a photoluminescence (PL) spectrum of nano-rods of P-type zinc oxide doped with antimony (Sb) of 0.5 at. % according to another embodiment of the present invention. Referring to FIG. 14, the nano-rods including the P-type zinc oxide exhibit an NBE characteristic at a wavelength from about 320 nm to about 430 nm in the ultraviolet (UV) domain and exhibit a deep-level emission (DLE) characteristics at a wavelength from about 450 nm to about 800 nm in the visible ray domain.

Figure 15:
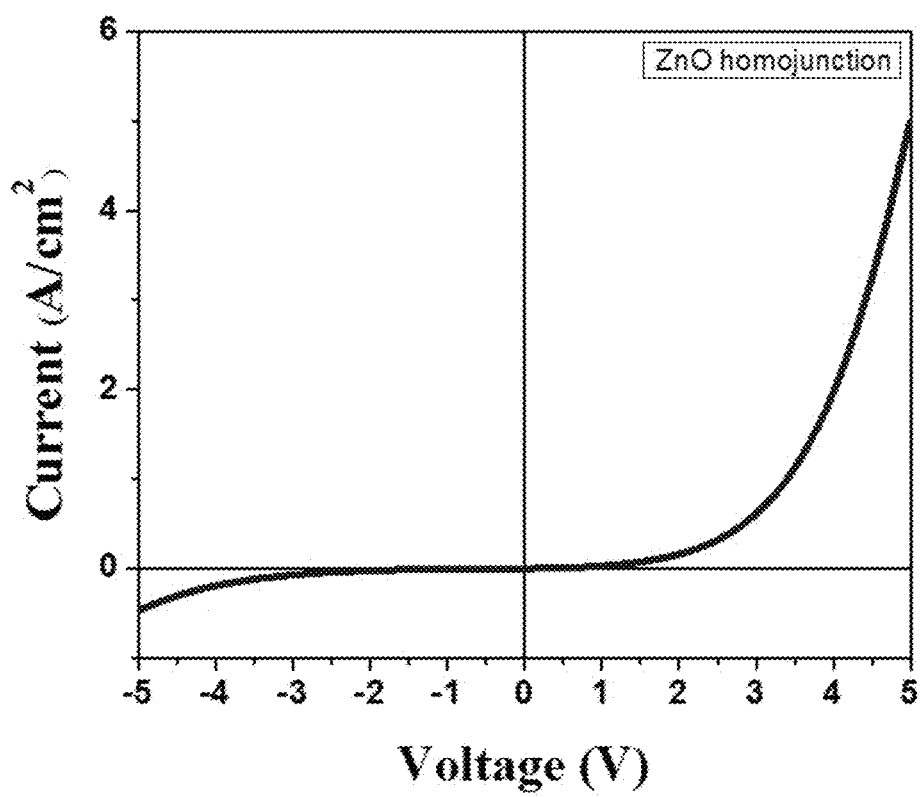
FIG. 15 is a graph showing current density-voltage characteristics of a light-emitting diode according to another embodiment of the present invention.

FIG. 15 is a graph showing current density-voltage characteristics of a light-emitting diode including nano-rods of P-type zinc oxide doped with antimony of 0.5 at. %/nano-rods of N-type zinc oxide according to another embodiment of the present invention.

Figure 16:
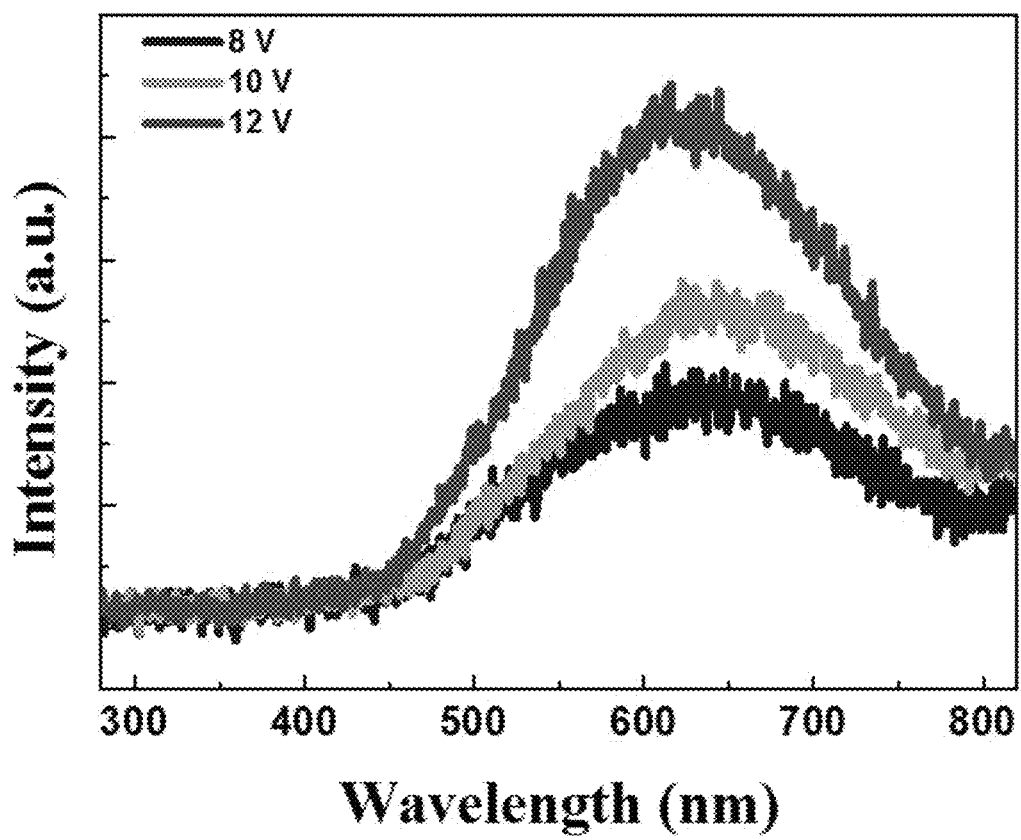
FIG. 16 is a graph showing an EL spectrum of a light-emitting diode according to another embodiment of the present invention.

FIG. 16 is a diagram showing an EL spectrum of a homojunction diode including Nano-rods of P-type zinc oxide doped with antimony of 0.5 at. %/nano-rods of N-type zinc oxide according to another embodiment of the present invention.

Figure 17:
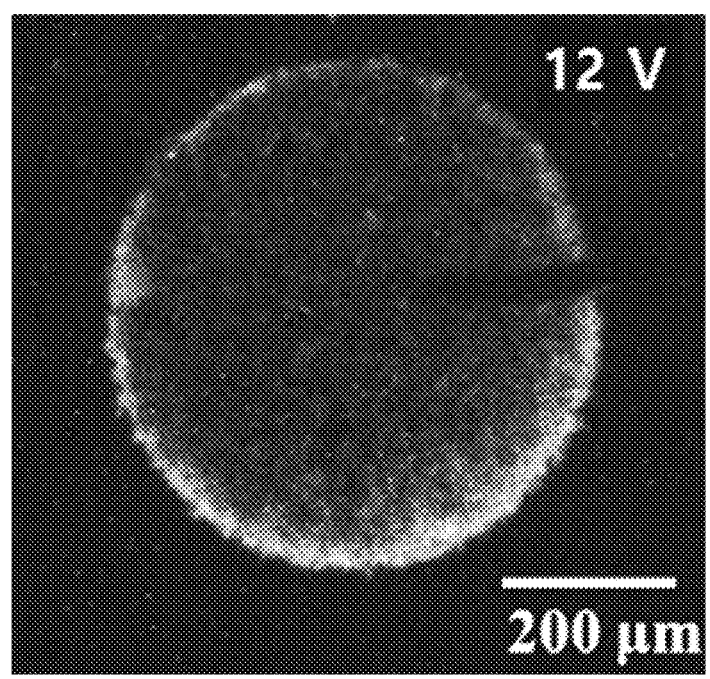
FIG. 17 is an image showing electroluminescence of a light-emitting diode according to another embodiment of the present invention.

FIG. 17 is an image showing electroluminescence when silver nano-wires are used as a top electrode according to another embodiment of the present invention.

According to an embodiment of the present invention, there is provided a light-emitting diode that includes a P-type zinc oxide layer including nano-discs of zinc oxide doped with an impurity and an N-type zinc oxide layer including nano-rods of zinc oxide forming a homogeneous junction having an epitaxial interface, may be inexpensively fabricated to have a large-size, exhibits improved light-emission efficiency and minimized power consumption, and may be fabricated at a low temperature.

According to an embodiment of the present invention, since a light-emitting diode including a P-type zinc oxide layer including nano-discs of zinc oxide doped with an impurity and an N-type zinc oxide layer that includes nano-rods of zinc oxide and constitute homojunction with an epitaxial interface, the light-emitting diode may be fabricated inexpensively and to have a large size, may improve light-emission efficiency, reduce power consumption, and have homojunction that may be formed in a low-temperature process According to another embodiment of the present invention, a method of fabricating a light-emitting diode having the above-described advantages may be provided.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homojunction having an epitaxial interface with the P-type zinc oxide layer; and
a second electrode formed on the N-type zinc oxide layer,
wherein the nano-disc has a thickness from about 200 nm to about 800 nm and a diameter from about 300 nm to about 1 μm,
wherein the nano-rods has a length from about 1 μm to about 4 μm and a thickness from about 100 nm to about 500 nm.

2. The light-emitting diode of claim 1, wherein the nano-discs have a crystal structure grown in the [0002] direction.

3. The light-emitting diode of claim 1, wherein the nano-rods have a crystal structure grown in the [0002] direction.

4. The light-emitting diode of claim 1, wherein, when the P-type zinc oxide layer comprises the nano-discs of zinc oxide doped with the impurity, the nano-discs are used as a template for growth of the N-type zinc oxide layer comprising nano-rods of zinc oxide.

5. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homojunction having an epitaxial interface with the P-type zinc oxide layer; and
a second electrode formed on the N-type zinc oxide layer,
wherein the nano-discs have interplanar lattice spacing between Miller index (0002) planes within a range from 0.2 nm to 0.3 nm.

6. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homo-junction having an epitaxial interface with the P-type zinc oxide layer; and
a second electrode formed on the N-type zinc oxide layer,
wherein the nano-discs exhibit strong near-band-edge emission (NBE) characteristics at a wavelength from 350 nm to 420 nm in the ultraviolet (UV) domain and have a photoluminescence (PL) spectrum exhibiting a deep-level emission (DLE) characteristic that is relatively weaker than NBE at a wavelength from 450 nm to 750 nm in the visible ray domain.

7. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homo-junction having an epitaxial interface with the P-type zinc oxide layer; and
a second electrode formed on the N-type zinc oxide layer,
wherein the nano-rods have interplanar lattice spacing between Miller index (0001) planes within a range from 0.4 nm to 0.6 nm.

8. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homo-junction having an epitaxial interface with the P-type zinc oxide layer; and
a second electrode formed on the N-type zinc oxide layer,
wherein the nano-rods exhibit near-band-edge emission (NBE) characteristics at a wavelength from 350 nm to 420 nm in the ultraviolet (UV) domain and have a photoluminescence (PL) spectrum exhibiting a deep-level emission (DLE) characteristic that is relatively stronger than NBE at a wavelength from 450 nm to 750 nm in the visible ray domain.

9. A light-emitting diode comprising:
a first electrode;
a P-type zinc oxide layer, which is formed on the first electrode, comprises nano-discs doped with an impurity or nano-rods of zinc oxide doped with an impurity;
an N-type zinc oxide layer, which is formed on the P-type zinc oxide layer, comprises nano-rods, and the nano-rods of the N-type zinc oxide layer constitutes homo-junction having an epitaxial interface with the P-type zinc oxide layer; and
a second electrode formed on the N-type zinc oxide layer,
wherein the impurity of the P-type zinc oxide layer comprises any one of antimony (Sb), arsenic (As), phosphor (P), bismuth (Bi), and combinations thereof.

10. The light-emitting diode of claim 9, wherein atomic concentration of the impurity is within a range from 0.5% to 7% of atomic concentration of zinc.

11. A method of fabricating a light-emitting diode comprising:
forming a first electrode on a substrate;
forming a first conductivity type zinc oxide layer on the first electrode;
forming a second conductivity type zinc oxide layer on the first conductivity type zinc oxide layer in order to form homojunction having an epitaxial interface with the first conductivity type zinc oxide layer; and
forming a second electrode on the second zinc oxide layer,
wherein the forming of the first conductivity type zinc oxide layer on the first electrode comprises forming a P-type zinc oxide layer comprising nano-discs doped with an impurity or nano-rods of zinc oxide doped with an impurity on the first electrode,
wherein the second zinc oxide layer is an N-type zinc oxide layer comprising nano-rods of zinc oxide.

12. The method of claim 11, wherein the step of forming a first conductivity type zinc oxide layer comprising further synthesizing the nano-discs of zinc oxide doped with the impurity,
wherein the synthesizing of the nano-discs comprises:
preparing a zinc precursor and a P-type dopant precursor;
providing a first mixture by mixing the zinc precursor with the P-type dopant precursor; and
inducing a chemical reaction in the first mixture in a high-pressure reactor.

13. The method of claim 12, further comprising providing a second mixture by adding a structure-directing agent to the first mixture.

14. The method of claim 12, further comprising:
cooling a reacted material by using the high-pressure reactor;
collecting precipitates comprising the nano-discs from the cooled reacted material; and
obtaining the nano-discs from collected white precipitates.

15. The method of claim 11, wherein the forming of the P-type zinc oxide layer comprises:
providing a dispersion solution having dispersed therein the nano-discs of zinc oxide;
dripping the dispersion solution onto a surface of a base material to form a two-dimensional layer of the nano-discs of zinc oxide on the surface of the base material; and
transferring the two-dimensional monolayer of the nano-discs of zinc oxide formed on the surface of the base material onto the first electrode.

16. The method of claim 11,
wherein the forming of the N-type zinc oxide layer comprises:
filling gaps between the nano-discs with an electrical insulator; and
growing the nano-rods on the top surfaces of the nano-discs using a hydrothermal synthesizing method, wherein the forming of the second electrode comprises:
filling gaps between the nano-rods with an electrical insulator; and
forming the second electrode on the top surfaces of the nano-rods.

17. The method of claim 11, wherein the forming of the first conductivity type zinc oxide layer on the first electrode comprises forming a P-type zinc oxide layer comprising nano-rods of zinc oxide doped with the impurity on the first electrode, and the second zinc oxide layer is an N-type zinc oxide layer comprising nano-rods of zinc oxide.

* * * * *